(12) United States Patent
Okubo et al.

(10) Patent No.: US 8,853,312 B2
(45) Date of Patent: *Oct. 7, 2014

(54) RESIN COMPOSITION AND SEMICONDUCTOR DEVICE PRODUCED BY USING THE SAME

(71) Applicant: Sumitomo Bakelite Co., Ltd., Tokyo (JP)

(72) Inventors: Hikaru Okubo, Tochigi (JP); Nobuki Tanaka, Tochigi (JP); Itaru Watanabe, Tochigi (JP)

(73) Assignee: Sumitomo Bakelite Co., Ltd, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/717,009

(22) Filed: Dec. 17, 2012

(65) Prior Publication Data

US 2013/0109798 A1 May 2, 2013

Related U.S. Application Data

(62) Division of application No. 13/307,289, filed on Nov. 30, 2011, now Pat. No. 8,614,270, which is a division of application No. 10/593,137, filed as application No. PCT/JP2005/004700 on Mar. 16, 2005, now Pat. No. 8,088,308.

(30) Foreign Application Priority Data

| Mar. 19, 2004 | (JP) | 2004-080921 |
| Mar. 23, 2004 | (JP) | 2004-083936 |
| Mar. 24, 2004 | (JP) | 2004-085885 |
| Dec. 22, 2004 | (JP) | 2004-371083 |
| Dec. 27, 2004 | (JP) | 2004-377430 |

(51) Int. Cl.
*C08K 3/08* (2006.01)
*C08L 79/08* (2006.01)
(Continued)

(52) U.S. Cl.
CPC .................. *C08F 220/58* (2013.01); *C08K 5/14* (2013.01); *H01L 2924/0103* (2013.01); *H01L 2924/01078* (2013.01); *H01L 2924/10253* (2013.01); *H01L 2924/01033* (2013.01); *H01L 2924/15747* (2013.01); *H01L 2924/01006* (2013.01); *H01L 24/83* (2013.01); *H01L 2924/01015* (2013.01); *H01L 24/29* (2013.01); *H01L 2924/01013* (2013.01); *C08K 5/0025* (2013.01); *H01L 2924/01047* (2013.01); *H01L 2924/01029* (2013.01); *H01L 2924/0105* (2013.01); *H01L 2924/01077* (2013.01); *C09J 179/08* (2013.01); *H01L 2924/30105* (2013.01); *C08K 3/26* (2013.01); *H01L 2924/12044* (2013.01); *C09J 201/025* (2013.01); *H01J 23/3737* (2013.01); *H01L 2924/07802* (2013.01); *H01L 2924/014* (2013.01); *H01L 2924/0665* (2013.01); *H01L 2924/01057* (2013.01); *H01L 2924/01046* (2013.01); *H01L 2224/29111* (2013.01); *H01L 2924/01079* (2013.01); *H01L 2924/1579* (2013.01);
(Continued)

(58) Field of Classification Search
CPC ............. H01L 2224/8385; H01L 2924/01047; H01L 2924/07025; C08K 3/08; C08K 2003/026; C08K 2201/005; C08L 79/085
USPC ........... 252/514; 524/403, 780; 526/320–322, 526/262
See application file for complete search history.

(56) References Cited

U.S. PATENT DOCUMENTS

| 3,729,446 A | 4/1973 | Holub et al. |
| 4,675,414 A | 6/1987 | DeFusco et al. |

(Continued)

FOREIGN PATENT DOCUMENTS

| CN | 1158607 A | 9/1997 |
| CN | 1395596 A | 2/2003 |

(Continued)

OTHER PUBLICATIONS

Japanese Office Action issued on Dec. 28, 2010 for Application No. 2006-511210.

(Continued)

*Primary Examiner* — Brieann R Fink
(74) *Attorney, Agent, or Firm* — Smith, Gambrell & Russell LLP

(57) ABSTRACT

A quick curing resin composition, which can be used in conventionally used ovens, and a semiconductor device, which is excellent in reliability such as solder crack resistance or the like when the resin composition, is used as a die attach material for semiconductor. The resin composition has a sufficient low stress property, good adhesion and excellent bleeding property. The resin composition includes a filler (A), compound (B) having the structure represented by the formula (1) and a functional group represented by the formula (2) and a thermal radical initiator (C), and substantially not containing a photo polymerization initiator.

Formula (1):

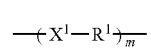

Formula (2):

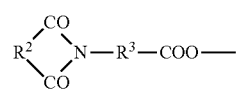

6 Claims, No Drawings

(51) Int. Cl.
*H01L 23/00* (2006.01)
*C09J 179/08* (2006.01)
*C09J 201/02* (2006.01)
*C08G 73/12* (2006.01)
*C08F 220/58* (2006.01)
*C08K 5/14* (2006.01)
*C08K 5/00* (2006.01)
*C08K 3/26* (2006.01)
*C08F 234/02* (2006.01)

(52) U.S. Cl.
CPC ............... *H01L 2924/01009* (2013.01); *H01L 2924/01004* (2013.01); *H01L 2924/01082* (2013.01); *C08F 234/02* (2013.01); *H01L 2924/01027* (2013.01); *H01L 2224/8385* (2013.01); *C08G 73/12* (2013.01); *H01L 2924/0102* (2013.01); *H01L 2224/2919* (2013.01); *H01L 2924/0132* (2013.01); *H01L 2924/01024* (2013.01); *C08K 3/08* (2013.01); *H01L 2924/01019* (2013.01); *H01L 2924/01005* (2013.01); *C08L 79/085* (2013.01)
USPC .......... 524/403; 524/780; 526/320; 526/321; 526/322; 526/262; 252/514

(56) References Cited

U.S. PATENT DOCUMENTS

| | | |
|---|---|---|
| 5,006,575 A | 4/1991 | Chan |
| 5,717,034 A | 2/1998 | Dershem et al. |
| 6,034,150 A | 3/2000 | Hoyle et al. |
| 6,034,195 A | 3/2000 | Dershem et al. |
| 6,265,530 B1 | 7/2001 | Herr et al. |
| 6,803,406 B2 | 10/2004 | Musa |
| 6,984,689 B2 | 1/2006 | Penot et al. |
| 7,026,370 B2 | 4/2006 | Biro et al. |
| 7,081,486 B2 | 7/2006 | Imai et al. |
| 7,160,946 B2 | 1/2007 | Takano |
| 7,576,139 B2 | 8/2009 | Sugiura et al. |
| 8,088,308 B2 * | 1/2012 | Okubo et al. ............ 252/514 |
| 2004/0102566 A1 | 5/2004 | Forray et al. |

FOREIGN PATENT DOCUMENTS

| | | |
|---|---|---|
| JP | 04159315 A | 6/1992 |
| JP | 10-168413 | 6/1998 |
| JP | 11-043587 | 2/1999 |
| JP | 11-106455 | 4/1999 |
| JP | 11-124403 | 5/1999 |
| JP | 2000-063452 | 2/2000 |
| JP | 2000-144041 | 5/2000 |
| JP | 2000-273326 | 10/2000 |
| JP | 2001-261939 | 9/2001 |
| JP | 2002-020721 | 1/2002 |
| JP | 2003-040939 | 2/2003 |
| JP | 2003040939 A | 2/2003 |
| JP | 2003-221443 | 8/2003 |
| JP | 2003-277699 | 10/2003 |
| JP | 2003-327925 | 11/2003 |
| JP | 2004-018749 | 1/2004 |
| JP | 2004-075904 | 3/2004 |
| WO | 96/07691 | 3/1996 |
| WO | 98/04602 | 2/1998 |
| WO | 98/10920 | 3/1998 |

OTHER PUBLICATIONS

Supplementary European Search Report issued Jan. 5, 2011 for Application No. EP 05 72 0935.
Chinese Office Action issued on Mar. 21, 2012 for Application No. 200910253142.8.
Machine translated English equivalent of JP 2003040939.
Derwent Abstract for JP 04159315. Derwent Acc. No. 1992-231959.

* cited by examiner

1

RESIN COMPOSITION AND SEMICONDUCTOR DEVICE PRODUCED BY USING THE SAME

This application is a division of Ser. No. 13/307,289 filed Nov. 30, 2011, which is a division of Ser. No. 10/593,137 (now as U.S. Pat. No. 8,088,308) filed Sep. 18, 2006, which is a 371 National Phase of PCT/JP2005/004700, filed Mar. 16, 2005, which claims priority from JP2004-080921, filed Mar. 19, 2004, JP2004-083936, filed Mar. 23, 2004, JP2004-085885, filed Mar. 24, 2004, JP2004-371083, filed Dec. 22, 2004 and JP2004-377430, filed Dec. 27, 2004, which all are being incorporated in their entirety herein by reference.

TECHNICAL FIELD

The present invention relates to a resin composition and a semiconductor device using the same.

BACKGROUND ART

Aiming at improvement on productivity in a die-bonding process, in the production of semiconductors, the in-line curing method in which a die bonder, a wire bonder and the like are arranged on the same line is employed and it is tending to be more widely used from now on. Hence, in comparison with a curing condition of a die attach paste in the conventionally employed batch method, time required for curing is significantly limited. For example, with respect to the conventional oven curing method wherein curing is performed at 150 to 200° C. for 60 to 90 minutes, curing is required in a short time such as at 150 to 200° C. for 15 to 90 seconds in the case of the in-line curing method (for example, see Japanese Patent Application Laid-Open (JP-A) No. 2000-63452).

With the enhancement of the processing speed of semiconductor devices, a chip surface layer which is weak in mechanical strength is growing popular. In order to decrease stress against the chip surface, it is required to minimize warpage of a semiconductor chip due to the difference in thermal expansion coefficient between the semiconductor chip and a copper frame. Also, it is required to prevent oxidation of the copper frame. Thus, for complying with these requirements, the curing process in low temperature is desired.

In relation with the above requirements of shortening of curing time and lowering of curing temperature, there is another problem, which is a requirement of thermal management. With significant increase in capacity and processing speed of semiconductor products and moving towards finer design rule, a problem of heat which generates during operation of semiconductor products is becoming prominent so that releasing the heat from semiconductor products, i.e. thermal management, is becoming an important issue. Hence, measures to mount heat dissipating members such as heat spreaders, heat sinks or the like on semiconductor products are generally employed. However, it is desired for material itself which bonds heat dissipating members to have higher thermal conductivity.

On the other hand, some forms of semiconductor products may allow a semiconductor chip itself to bond to a heat spreader made of metal, a heat spreader to bond to a die pad portion of a lead frame to which a semiconductor chip is also bonded, or a die pad portion to expose at the package surface so as to serve as a heat sink as well. Further, a semiconductor chip may be bonded to an organic substrate having heat dissipating mechanism or the like such as a thermal via or the like. High thermal conductivity is also required to the material which bonds a semiconductor chip in such a case. In this manner, high thermal conductivity is required to die attach materials or materials for bonding heat dissipating members. At the same time, the die attach materials and the materials for bonding heat dissipating members are required to endure a reflow process performed when a semiconductor product is mounted on a substrate, often required to have bonding in large area, and also required to have low stress property in order to suppress warpage or the like due to different thermal expansion coefficients among component members.

However, a highly thermal conductive adhesive has some problems as follows (For example, see JP-A No. Hei. 11-43587). Generally, thermally conductive particles such as metal fillers such as silver powder, copper powder or the like, or ceramic fillers such as aluminum nitride, boron nitride or the like are added to an organic binder of the highly thermal conductive adhesive at high containing rate. However, since there is a limit in containing amount, there are cases that high thermal conductivity cannot be obtained. Also, though the highly thermal conductive adhesive containing a large amount of solvent has a good thermal conductivity as a sole cured product, the state when it is applied to a semiconductor product may not have a stable thermal conductivity since the solvent remains in the cured product or the solvent volatilizes to leave voids. Even if the adhesive could contain a large amount of thermally conductive particles, there are cases that low stress property is insufficient due to high containing rate of the thermally conductive particles.

On the other hand, as a part of considerations for the environment, since it has become to use a lead-free solder as a solder for mounting on a substrate, reflow temperature needs to be raised compared to the reflow temperature when Sn—Pb solder has been used. Because the use of such a lead-free solder causes increase of stress due to raised reflow temperature, semiconductor products easily generate delamination and thus cracking during the reflow process. Therefore, even higher reflow resistance (high reflow reliability) is demanded to constituent materials of semiconductor products than ever.

Further, at present, abolition of lead from semiconductor products is in progress as a part of considerations for the environment. The case is increasing to change plating of lead frames to Ni—Pd plating in order to exclude lead from outer lead plating of semiconductor products. In case of Ni—Pd plating lead frame, there is usually very thin gold plating (gold flash) on the surface to be stable. However, adhesion strength of a surface decreases in comparison with a normal copper frame with silver plating or the like because of smoothness of Ni—Pd plating and presence of gold on the surface. Thus, there are cases that a surface of Ni—Pd plated frame is chemically or physically roughened to improve the adhesion strength. However, such a roughened surface often causes resin bleeding of die attach paste which leads to serious problems such as decline in package reliability.

In relation to the above-mentioned problems, in case of epoxy resin type die attach paste, which is a major die attach paste at present, curing can be performed in about 60 seconds by using amine type curing agents or the like, however, curing in a very short time such as 15 to 30 seconds is not handled yet.

On the other hand, it is known, for example, in the following arts that adhesion particularly with metal improves by using compounds having an imide group such as maleimide or the like. That is, Japanese translation of PCT international application (JP-T) No. Hei. 10-505599, JP-T No. 2000-514496, JP-T No. 2001-501230, JP-A. No. 11-106455, JP-A No. 2001-261939 and JP-A No. 2002-20721. However, there are disadvantages that water absorption property of a cured product becomes high when an imide compound is used solely so as to deteriorate properties of a cured product after moisture absorption since imide compounds have high polarity. Also, when it is used together with other components, it is necessary to add components having high polarity in order to mix uniformly. As for these added components, similarly as above, properties of a cured product after moisture absorption deteriorate. There has not been any satisfactory compound particularly in view of adhesion to hardly adhesive surfaces such as Ni—Pd plated frames or the like, low stress property against increase of stress caused by raised reflow temperature due to the change to lead-free solder, and moisture resistance.

Also, a material which has better adhesion to Ni—Pd plated frames than conventionally used die attach pastes (for example, see JP-A No. 2000-273326), has excellent low stress property in terms of low elastic modulus, and does not generates resin bleeding is desired, however, there has not been satisfactory material.

DISCLOSURE OF INVENTION

The present invention has been achieved in light of the above-stated conventional problems. A first object of the present invention is to provide a resin composition which is excellent in quick curing and can be used for curing in conventionally used ovens, and a semiconductor device which is excellent in reliability such as solder crack resistance or the like when the resin composition is used as a die attach material for semiconductor.

A second object of the present invention is to provide a resin composition which has a sufficient low stress property, good adhesion and preferably excellent bleeding property, and a semiconductor device which is excellent in reliability when the resin composition is used as a die attach material for semiconductor or a material for bonding a heat dissipating member.

The above objects of the present invention can be attained by a resin composition comprising a filler (A), the following compound (B) and a thermal radical initiator (C), and substantially not containing a photo polymerization initiator, and a semiconductor device of high reliability can be obtained by using the resin composition:
Compound (B):
  a compound containing a structure represented by the following formula (1) in a main chain and having at least one functional group represented by the following formula (2):

Formula (1):

$$-(-X^1-R^1-)_m-\quad (1)$$

wherein $X^1$ is —O—, —COO— or —OCOO—; $R^1$ is a hydrocarbon group having 1 to 6 carbons; "m" is an integer of 1 or more and 50 or less; and if the formula contains two or more parts which are denoted by the same symbol, each of them may be the same or different from each other;

Formula (2):

$$R^2 \diagdown_{CO}^{CO} \diagup N-R^3-COO-\quad (2)$$

wherein $R^2$ is —$C_2H_2$— or —$C_3H_4$—; $R^3$ is a hydrocarbon group having 1 to 11 carbons; and if the formula contains two or more parts which are denoted by the same symbol, each of them may be the same or different from each other.

Among the compounds (B), a bismaleimide compound (B') represented by the following formula (3) is a particularly preferable compound:
Bismaleimide Compound (B'):

Formula (3):

$$\text{CH}-\text{CO} \diagdown_{CR^4-CO}^{} N-R^5-COO-R^6-(-X^2-R^6-)_n-COO-R^5-N \diagup_{CO-CR^4}^{CO-CH} \quad (3)$$

wherein $X^2$ is —O—, —COO— or —OCOO—; each $R^4$ is hydrogen atom or a methyl group; each $R^5$ is a hydrocarbon group having 1 to 11 carbons; each $R^6$ is a hydrocarbon group having 3 to 6 carbons; "n" is an integer of 1 or more and 50 or less; and if the formula contains two or more parts which are denoted by the same symbol, each of them may be the same or different from each other.

The resin composition of the present invention comprises the filler (A), the compound (B) and the thermal radical initiator (C) as essential components, and further other optional components can be added. Among combinations of such essential components and optional components, there are first to sixth composition systems as particularly preferable compositions.
(1) A First Composition System
  A first composition system comprises at least the filler (A), the compound (B), the thermal radical initiator (C) and the following compound (D), substantially not containing a photo polymerization initiator:
Compound (D):
  A compound (D) is a compound containing a structure represented by the formula (4) in a main chain and having at least one functional group having a polymerizable C—C unsaturated bond:

Formula (4):

$$-(-X^3-R^7-)_p-\quad (4)$$

wherein $X^3$ is —O—, —COO— or —OCOO—; $R^7$ is a hydrocarbon group having 3 to 6 carbons; "p" is an integer of 1 or more and 50 or less; and if the formula contains two or more parts which are denoted by the same symbol, each of them may be the same or different from each other.
(2) A Second Composition System
  A second composition system comprises at least the filler (A), the compound (B), the thermal radical initiator (C), the compound (D) used in the first composition system and a combination of the following compound (L) and the following compound (M), substantially not containing a photo polymerization initiator:
Compound (L):
  A compound (L) is a compound containing the following structure represented by the formula (11) in a main chain and having at least one glycidyl group:

Formula (11):

$$-(-X^7-R^{15}-)_u-\quad (11)$$

wherein $X^7$ is —O—, —COO— or —OCOO—; $R^{15}$ is a hydrocarbon group having 3 to 6 carbons; "u" is an integer of 2 or more and 50 or less; and if the formula contains two or more parts which are denoted by the same symbol, each of them may be the same or different from each other;

Compound (M):

A compound (M) is a compound having a functional group which can react with the glycidyl group of the compound (L).

(3) A Third Composition System

A third composition system comprises at least the filler (A), the compound (B), the thermal radical initiator (C) and the following acrylic ester compound (E), substantially not containing a photo polymerization initiator:

Acrylic Ester Compound (E):

An acrylic ester compound (E) is a compound represented by the following formula (5):

Formula (5):

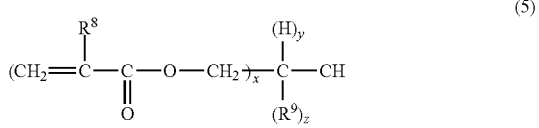

(5)

wherein $R^8$ is hydrogen atom or a methyl group; $R^9$ is a hydrocarbon group having 1 to 3 carbons; "x", "y" and "z" are in the relationship expressed by (x+y+z)=3, 1≤x≤3, and 0≤z≤2; and if the formula contains two or more parts which are denoted by the same symbol, each of them may be the same or different from each other.

(4) A Forth Composition System

A forth composition system comprises at least the filler (A), the compound (B), the thermal radical initiator (C) and the following acrylamide compound (F), substantially not containing a photo polymerization initiator:

Acrylamide Compound (F):

An acrylamide compound (F) is a compound containing a structure represented by the following formula (6) in a main chain and having at least one functional group represented by the following formula (7):

Formula (6):

(6)

Formula (7)

$$CH_2=CR^{11}-CONH-\qquad(7)$$

wherein $X^4$ is —O—, —COO— or —OCOO—; $R^{10}$ is a hydrocarbon group having 3 to 6 carbons; $R^{11}$ is hydrogen atom or a methyl group; "r" is an integer of 1 or more and 50 or less; and if the formula contains two or more parts which are denoted by the same symbol, each of them may be the same or different from each other.

(5) A Fifth Composition System

A fifth composition system comprises at least the filler (A), the compound (B), the thermal radical initiator (C) and the following allyl ester compound (G), substantially not containing a photo polymerization initiator:

Allyl Ester Compound (G):

An allyl ester compound (G) is a compound having at least one functional group represented by the following formula (8):

Formula (8):

$$CH_2=CH-CH_2-OCO-R^{12}-\qquad(8)$$

wherein $R^{12}$ is a hydrocarbon group having 2 to 8 carbons.

(6) A Sixth Composition System

A sixth composition system comprises at least the filler (A), the compound (B), the thermal radical initiator (C), the following compound (H) and a reactive diluent (I), substantially not containing a photo polymerization initiator:

Compound (H):

A compound (H) is a compound derived from a hydrocarbon having at least one C—C unsaturated bond in one molecule, which has a number average molecular weight of 500 to 5,000, contains a structures represented by the following formula (10) at its modified position, and has at least one functional group having a polymerizable C—C unsaturated bond:

Formula (10):

(10)

wherein $X^6$ is —O—, —COO— or —OCOO—; $R^{14}$ is a hydrocarbon group having 3 to 6 carbons; "t" is an integer of 1 or more and 50 or less; and if the formula contains two or more parts which are denoted by the same symbol, each of them may be the same or different from each other.

A resin composition of the present invention, particularly a resin composition which belongs to any of the above-mentioned first to sixth composition systems, is excellent in adhesion strength, quick curability, moisture resistance and low stress property, is also applicable to the oven curing, and is excellent in adhesion particularly between a copper lead frame and a semiconductor chip when it is used as an adhesive of a semiconductor chip. Also, the obtained semiconductor device is excellent in solder crack resistance. As a result, a semiconductor device which is high in reliability can be obtained.

Also, among the resin compositions of the present invention, the composition which belongs to the third composition system exhibits excellent bleeding property as well as good low stress property and good adhesion, therefore, a semiconductor device excellent in reliability can be obtained by using the resin composition as a die attach material for a semiconductor or a bonding material for a heat dissipating member or an attach material for a heat sink member.

BEST MODE FOR CARRYING OUT THE INVENTION

Hereinafter, the embodiment of the present invention will be explained in more detail. In the present invention, "(meth)acryl" denotes acryl and/or methacryl, and "(meth)acryloyl" denotes acryloyl and/or methacryloyl.

According to the present invention, a resin composition significantly suitable for as an adhesive for a semiconductor chip or a heat dissipating member can be provided, wherein the resin composition comprises at least a filler (A), the following compound (B) and a thermal radical initiator (C), substantially not containing a photo polymerization initiator:

Compound (B):

a compound containing a structure represented by the following formula (1) in a main chain and having at least one functional group represented by the following formula (2):

Formula (1):

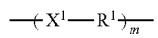
(1)

wherein $X^1$ is —O—, —COO— or —OCOO—; $R^1$ is a hydrocarbon group having 1 to 6 carbons; "m" is an integer of 1 or more and 50 or less; and if the formula contains two or more parts which are denoted by the same symbol, each of them may be the same or different from each other;

Formula (2):

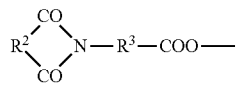
(2)

wherein $R^2$ is —$C_2H_2$— or —$C_3H_4$—; $R^3$ is a hydrocarbon group having 1 to 11 carbons; and if the formula contains two or more parts which are denoted by the same symbol, each of them may be the same or different from each other.

As the filler (A) used in the present invention, silver powder is often used. A containing amount thereof is normally 70 to 95 wt % in a resin composition. As the filler (A) besides the above, for example, gold powder, copper powder, nickel powder, palladium powder, aluminum nitride, boron nitride, calcium carbonate, silica, alumina or the like can also be used.

When using the silver powder, generally, commercially available silver powder (A) for electronic material may be used. As such silver powder, reduced powder, atomized powder and the like are available. Preferable particle size is 1 to 30 μm in average particle size since if the average particle size is smaller than this range, viscosity of a resin composition becomes too high, and if the average particle size is larger than this range, it will cause clogging of dispensing nozzle. Silver powder other than one for electronic material may include large amount of ionic impurity, thus, materials should be carefully selected. Silver powder having silver containing rate of 90 wt % or more may be used preferably. Silver powder having silver containing rate of 90 wt % or more may be used as alloy of the silver powder and other metals, however, silver powder having silver containing rate lower than the above is not preferable as thermal conductivity may decrease. The form may not be particularly limited and may be in a flake-like form, spherical form or the like. Preferably, silver powder in a flake-like form may be used and generally contained at 70 to 95 wt % in a resin composition. If the containing rate of silver powder is lower than the above, thermal conductivity, and in some cases, required electric conductivity may be deteriorated. If the containing rate of silver powder is higher than the above, viscosity of a resin composition may become too high.

In the compound (B) containing a structure represented by the formula (1) in a main chain and having at least one functional group represented by the formula (2) used in the present invention, it is preferable that hydrocarbon $R^1$ contained in a repeating unit of the main chain does not contain an aromatic group. Also, hydrocarbon $R^1$ may have 1 to 6 carbons, however, it is preferable to limit in the range of 3 to 6. By allowing hydrocarbon $R^1$ to have 3 or more carbons, deterioration of moisture resistivity of a cured product can be prevented, and it is possible to make properties such as adhesion strength or the like be hard to deteriorate under severe condition in water treatment such as PCT (the pressure cooker test) or the like. Hydrocarbon $R^1$ is set to have 6 or less carbons since if there are more carbons, hydrophobic property of a resin becomes too strong and adhesion strength to a metal surface or the like which is easily oxidized such as copper or the like may deteriorate. A hydrocarbon group having 3 or 4 carbons is more preferable.

In the repeating unit, —O—, —COO— or —OCOO— is contained as a part represented by a symbol "$X^1$". They are necessary to exhibit flexibility of a cured product and also to be in liquid state as raw material or to improve solubility to other components. The part represented by the symbol "$X^1$" is preferably —O— (ether bond).

Further, a repeating number "m" may be in the range of 1 to 50. However, if the repeating number "m" is 1, flexibility of a targeted cured product may not be exhibited, thus, the repeating number may be preferably 2 or more. If the repeating number "m" becomes more than 50, viscosity becomes too high and it is not preferable for practical use. If a repeating unit satisfies the above condition, two or more kinds of such repeating units may be used or a copolymer with other component may be used.

Further, the functional group represented by the formula (2) is necessary to exhibit good adhesion strength to a metal plated surface such as silver plating or nickel/palladium plating, and two functional groups may be preferably contained in one molecule.

Hydrocarbon $R^2$ contained in the functional group may preferably be —$C_2H_2$—. Hydrocarbon $R^3$ contained in the functional group preferably does not contain an aromatic group and may have 1 to 5 carbons, and —$CH_2$— is particularly preferable as $R^3$.

Among the compounds (B), a bismaleimide compound (B') represented by the following formula (3) is particularly preferable.

Bismaleimide compound (B'):

Formula (3):

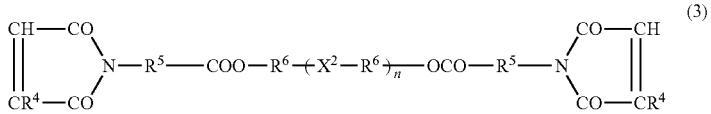
(3)

wherein $X^2$ is —O—, —COO— or —OCOO—; each $R^4$ is hydrogen atom or a methyl group; each $R^5$ is a hydrocarbon group having 1 to 11 carbons; each $R^6$ is a hydrocarbon group having 3 to 6 carbons; "n" is an integer of 1 or more and 50 or less; and if the formula contains two or more parts which are denoted by the same symbol, each of them may be the same or different from each other.

The bismaleimide compound (B') exhibits good fluidity and good adhesion even if a filler (A), particularly silver powder, is compounded. A maleimide group or a derivative thereof is contained in the bismaleimide compound (B') as a functional group. By using them together with a thermal radical initiator (C) to be hereinafter described, good reactivity is exhibited when heated, and due to polarity of an imide group, good adhesion to hardly adhesive metal surfaces, for example, silver plating, Ni—Pd plating or the like, can be exhibited.

The bismaleimide compound (B') has two functional groups in one molecule since the following are taken into account. If there is one functional group, improvement of adhesion strength is not sufficient than expected. If there are three or more functional groups, molecular weight increases so as to raise viscosity which leads a resin composition to have high viscosity.

Conventionally, as a difunctional maleimide compound, maleimide compounds using aromatic amine as raw material are well known, however, it is difficult to obtain the aromatic amine base bismaleimde in liquid form in room temperature as the aromatic amine base bismaleimde has generally high crystalline property. Such maleimide compound is soluble in solvents having high boiling point and polarity such as dimethylformamide, N-methylpyrrolidone or the like, however, when such solvents are used, voids are generated upon heat-curing a resin composition to deteriorate thermal conductivity, thus, such solvents cannot be used. As the bismaleimide compound (B') is in liquid form at room temperature, it is not necessary to use a solvent. Even if it is necessary to dilute, the bismaleimide compound (B') exhibits good affinity with generally used vinyl compounds in liquid form, thus, it can be diluted by vinyl compounds in liquid form. Among them, a vinyl compound having a (meth)acryloyl group is suitably used as a diluent since it can be copolymerized with the bismaleimide compound (B').

In the bismaleimide compound (B'), $R^5$ of the formula (3) may be a hydrocarbon group having 1 to 11 carbons, preferably not containing an aromatic. Also, it is preferable that the hydrocarbon group has 1 to 5 carbons. If there are 6 or more carbons, crystalline property becomes high and may be unable to be used. $R^5$ preferably may have only one carbon or 5 carbons, and particularly $R^5$ having 1 carbon is preferable.

$R^6$ of the formula (3) is a hydrocarbon group having 3 to 6 carbons, preferably not containing an aromatic group. If there is less carbon, deterioration of moisture resistivity may occur and it causes deterioration of properties such as adhesion strength or the like under severe condition in water treatment such as PCT or the like. On the other hand, if there are more carbons, hydrophobic property of a resin composition becomes too strong and adhesion strength to a metal surface or the like which is easily oxidized such as copper or the like may deteriorate and also crystalline property becomes too high. Thus, either case cannot be used. A hydrocarbon group having 3 or 4 carbons is more preferable.

—O—, —COO— or —OCOO— is contained as $X^2$ of the formula (3). They are necessary to exhibit flexibility of a cured product and also to be in liquid state as raw material or to improve solubility to other components. Among them, preferably $X^2$ may be —O—.

Further, the repeating number "n" of the repeating unit contained in the formula (3) may be 50 or less. If the repeating number "n" becomes over 50, viscosity becomes too high and it is not preferable for practical use. If a repeating unit satisfies the above condition, two or more kinds of such repeating units may be used or a copolymer with other component may be used.

Such a composition is available by reacting a compound having an amino group and a carboxyl group, wherein the compound has a hydrocarbon group having 1 to 5 carbons between the amino group and the carboxyl group (namely, amino acid such as glycine, alanine, aminocaproic acid or the like), and maleic anhydride or the derivative thereof to synthesize a maleimide of amino acid, and reacting the product with polyalkylene oxide diol, polyalkylene ester diol or the like.

In the present invention, a thermal radical initiator (C) is used as a reaction initiator for the above-mentioned compound (B) and other polymerizable components to be mentioned below. Generally, there is no particular limit if it can be used as a thermal radical initiator. Preferable thermal radical initiator has a decomposition temperature of 40 to 140° C. in terms of a decomposition starting temperature measured by a rapid heating test wherein decomposition starting temperature is detected so as that 1 g of sample on an electric heating plate is heated while rising temperature by 4° C./min. If the decomposition temperature is less than 40° C., storage stability of a resin composition at normal temperature deteriorates, and if the decomposition temperature is over 140° C., curing time becomes extremely long which is not preferable.

As examples of a thermal radical polymerization initiator satisfying such requirement, there may be methyl ethyl ketone peroxide, methylcyclohexanone peroxide, methylacetoacetate peroxide, acetylacetone peroxide, 1,1-bis(t-butylperoxy)-3,3,5-trimethylcyclohexane, 1,1-bis(t-hexylperoxy)cyclohexane, 1,1-bis(t-hexylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclododecane, n-butyl-4,4-bis(t-butylperoxy)valerate, 2,2-bis(t-butylperoxy)butane, 1,1-bis(t-butylperoxy)-2-methylcyclohexane, t-butylhydro peroxide, p-methanehydro peroxide, 1,1,3,3-tetramethylbutylhydro peroxide, t-hexylhydro peroxide, dicumyl peroxide, 2,5-dimethyl-2,5-bis(t-butylperoxy)hexane, α,α'-bis(t-butylperoxy)diisopropylbenzene, t-butylcumyl peroxide, di-t-butyl peroxide, 2,5-dimethyl-2,5-bis(t-butylperoxy)hexyne-3, isobutyryl peroxide, 3,5,5-trimethylhexanoyl peroxide, octanoyl peroxide, lauroyl peroxide, cinnamic acid peroxide, m-toluoyl peroxide, benzoyl peroxide, diisopropyl peroxydicarbonate, bis(4-t-butylcyclohexyl)peroxydicarbonate, di-3-methoxybutylperoxydicarbonate, di-2-ethylhexylperoxydicarbonate, di-sec-butylperoxydicarbonate, di(3-methyl-3-methoxybutyl)peroxy dicarbonate, di(4-t-butylcyclohexyl) peroxy dicarbonate, α,α'-bis(neodecanoylperoxy)diisopropylbenzene, cumylperoxyneodecanoate, 1,1,3,3-tetramethylbutylperoxy neodecanoate, 1-cyclohexyl-1-methylethylperoxy neodecanoate, t-hexylperoxy neodecanoate, t-butylperoxy neodecanoate, t-hexylperoxy pivalate, t-butylperoxy pivalate, 2,5-dimethyl-2,5-bis(2-ethylhexanoylperoxy)hexane, 1,1,3,3-tetramethylbutylperoxy-2-ethylhexanoate, 1-cyclohexyl-1-methylethylperoxy-2-ethylhexanoate, t-hexylperoxy-2-ethylhexanoate, t-butylperoxy-2-ethylhexanoate, t-butylperoxy isobutyrate, t-butylperoxy maleic acid, t-butylperoxy laurate, t-butylperoxy-3,5,5-trimethyl hexanoate, t-butylperoxyisopropyl monocarbonate, t-butylperoxy-2-ethylhexyl monocarbonate, 2,5-dimethyl-2,5-bis(benzoylperoxy)hexane, t-butylperoxy acetate, t-hexylperoxy benzoate, t-butylperoxy-m-toluoyl benzoate, t-butylperoxy benzoate, bis(t-butylperoxy)isophthalate, t-butylperoxyallyl monocarbonate, 3,3',4,4'-tetra(t-butylperoxycarbonyl)benzophenone or the like.

They may be used solely or in mixture of two or more kinds to control curability.

Although it is not particularly limited, it is preferable that the thermal radical initiator (C) is contained by 0.001 to 2 wt % in a resin composition.

A resin composition of the present invention is generally used under lighting such as a fluorescent light or the like, hence, if a photo polymerization initiator is contained, rise in viscosity is observed due to the reaction while using the resin composition. Thus substantially, a photo polymerization initiator cannot be contained. The term "substantially" means that a very small amount of a photo polymerization initiator may be present as far as rise in viscosity is not observed, and preferably a photo polymerization initiator is not contained.

A resin composition of the present invention comprises a filler (A), the compound (B) and a thermal radical initiator (C), and together at least one selected from the following compound (D), the following acrylic ester compound (E), the following acrylamide compound (F), the following allyl ester compound (G) and the following compound (H), thereby, better adhesion property and physical property after curing, for example, one or more properties among quick curing, adhesion, reflow resistance, low stress property, bleeding property and other properties can be improved.

Similarly to the compound (B), these compounds (D) to (H) are components which can start radical polymerization reaction by a thermal radical initiator and copolymerizable with the compound (B).

A compound (D) used in the present invention is a compound containing a structure represented by the formula (4) in a main chain and having at least one functional group having a polymerizable C—C unsaturated bond:

Formula (4):

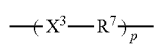

(4)

wherein $X^3$ is —O—, —COO— or —OCOO—; $R^7$ is a hydrocarbon group having 3 to 6 carbons; "p" is an integer of 1 or more and 50 or less; and if the formula contains two or more parts which are denoted by the same symbol, each of them may be the same or different from each other.

The compound (D) limits the hydrocarbon group $R^7$ contained in a repeating unit ($X^3$—$R^7$) in a main chain to a hydrocarbon group having 3 to 6 carbons since if there is less carbon, deterioration of moisture resistivity may occur and it causes deterioration of properties such as adhesion strength or the like under severe condition in water treatment such as PCT or the like. On the other hand, if there are more carbons, hydrophobic property of a resin becomes too strong and adhesion strength to a metal surface or the like which is easily oxidized such as copper or the like may deteriorate.

In the repeating unit ($X^3$—$R^7$), —O—, —COO— or —OCOO— is contained as a part represented by a symbol "$X^3$". They are necessary to allow a cured product to exhibit flexibility and sufficient adhesion strength.

It is not preferable for practical use that the repeating number "p" becomes over 50 as viscosity rises. If the repeating unit satisfies the above condition, two or more kinds of such repeating units may be used or a copolymer with other component may be used.

As a functional group having a polymerizable C—C unsaturated bond, there may be a (meth)acryloyl group, a vinyl group or the like, but may not be particularly limited thereto and plural kinds may be used together. The compound (D) preferably has two or more C—C unsaturated bonds in one molecule.

The acrylic ester compound (E) is a compound represented by the following formula (5):

Formula (5):

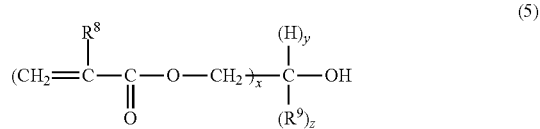

(5)

wherein $R^8$ is hydrogen atom or a methyl group; $R^9$ is a hydrocarbon group having 1 to 3 carbons and preferably an alkyl group; "x", "y" and "z" are in the relationship expressed by $(x+y+z)=3$, $1 \leq x \leq 3$, $0 \leq y \leq 2$ and $0 \leq z \leq 2$; and if the formula contains two or more parts which are denoted by the same symbol, each of them may be the same or different from each other.

Generally, a low viscosity acrylic ester compound such as mono(meth)acrylate, di(meth)acrylate or the like is used as a reactive diluent. By using the acrylic ester compound (E) represented by the formula (5), good adhesion and excellent bleeding property can be exhibited.

The term "bleeding" means a phenomenon wherein a resin component of a resin composition spreads on a surface to be bonded when the resin composition is applied on the parts to be bonded such as a lead frame or the like or during heat-curing. It is an undesirable phenomenon as the bleeding may cause inferiority of the ground bonding (wire bonding from a semiconductor chip to a die pad), or may cause decline in adhesion strength of encapsulant of a die pad and thus delamination, and cracking. Herein, the term "excellent in bleeding property" means that breeding is hard to generate, that is, the above-mentioned problems are hard to occur. As a particularly preferable compound (E) represented by the formula (5), there may be a compound wherein $R^8$ is a methyl group, $R^9$ is a methyl group, $x=1$, $y=1$, and $z=1$ or a compound wherein $R^8$ is a methyl group, $x=2$, $y=1$, and $z=0$.

The acrylamide compound (F) used in the present invention is a compound containing a structure represented by the following formula (6) in a main chain and having at least one functional group represented by the following formula (7):

Formula (6):

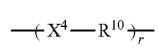

(6)

Formula (7)

$CH^2=CR^{11}$—CONH— (7)

wherein $X^4$ is —O—, —COO— or —OCOO—; $R^{10}$ is a hydrocarbon group having 3 to 6 carbons; $R^{11}$ is hydrogen atom or a methyl group; "r" is an integer of 1 or more and 50 or less; and if the formula contains two or more parts which are denoted by the same symbol, each of them may be the same or different from each other.

The acrylamide compound (F) limits the hydrocarbon group $R^{10}$ contained in a repeating unit ($X^4$—$R^{10}$) in a main chain to a hydrocarbon group having 3 to 6 carbons, preferably 3 or 4 carbons, since If there is less carbon, deterioration of moisture resistivity may occur and it causes deterioration of properties such as adhesion strength or the like under severe condition in water treatment such as PCT or the like. On the other hand, if there are more carbons, hydrophobic property of a resin becomes too strong and adhesion strength to a metal surface or the like which is easily oxidized such as copper or the like may deteriorate.

In the repeating unit)($X^4$—$R^{10}$, any bond of —O—, —COO— or —OCOO—, preferably —O—, may be contained as a part represented by a symbol "$X^4$". They are necessary to exhibit flexibility of a cured product and also to be in liquid state as raw material or to improve solubility to other components.

It is not preferable for practical use that the repeating number "r" becomes over 50 as viscosity rises. If the repeating unit satisfies the above condition, two or more kinds of such repeating units may be used or a copolymer with other component may be used.

Further, the functional group represented by the formula (7) is necessary to exhibit good adhesion strength to a metal plated surface such as silver plating or nickel/palladium plating, and two functional groups may be preferably contained in one molecule.

As the acrylamide compound (F), there may be a compound which is obtained by reacting a compound having a hydroxyl group on each end, at least one repeating unit selected from propylene oxide tetramethylene oxide and butylene oxide and a molecular weight of 300 to 2500 with dibasic acid anhydride such as succinic anhydride followed by reacting with (meth)acrylamide having a hydroxyl group such as 2-hydroxyethyl(meth)acrylamide or the like.

The allyl ester compound (G) used in the present invention is a compound having at least one functional group represented by the following formula (8):

Formula (8)

$$CH_2=CH-CH_2-OCO-R^{12}- \quad (8)$$

wherein $R^{12}$ is a hydrocarbon group having 2 to 8 carbons.

The allyl ester compound (G) having a functional group represented by the formula (8) can be copolymerized with the compound (B) having a functional group represented by the formula (2), and has excellent balance between adhesion and low stress property of a cured product.

As for number of functional groups represented by the formula (8), at least one functional group is necessary in one molecule from the viewpoint of curability. More preferably, two or more functional groups may be contained in one molecule. $R^{12}$ contained in the functional group is a hydrocarbon group having 2 to 8 carbons and may be aliphatic chain, alicyclic or aromatic group. It is preferable that an aromatic group may not be contained from the viewpoint of adhesion.

Particularly, when low stress property is required to a cured product, a structure represented by the following formula (9) is preferably contained in a molecule structure.

Formula (9):

wherein $X^5$ is —O—, —COO— or —OCOO—; $R^{13}$ is a hydrocarbon group having 3 to 6 carbons; "s" is an integer of 1 or more and 50 or less; and if the formula contains two or more parts which are denoted by the same symbol, each of them may be the same or different from each other.

$R^{13}$ contained in the structure represented by the formula (9) is a hydrocarbon group having 3 to 6 carbons. It is not preferable if there is less carbon as it is more likely to absorb water and also if there are more carbons as hydrophobic property becomes too strong to deteriorate adhesion strength.

The repeating number "s" is an integer of 1 or more and 50 or less. If the number is more than 50, molecule weight becomes too large to cause increase in viscosity and not preferable from the viewpoint of workability. More preferable hydrocarbon group may have 3 to 4 carbons and a repeating number may be 2 to 20.

The compound (H) used in the present invention is a derivative of a hydrocarbon having at least one C—C unsaturated bond in one molecule, which has a number average molecular weight of 500 to 5,000, contains a structure represented by the following formula (10) at its modified position, and has at least one functional group having a polymerizable C—C unsaturated bond:

Formula (10):

wherein $X^6$ is —O—, —COO— or —OCOO—; $R^{14}$ is a hydrocarbon group having 3 to 6 carbons; "t" is an integer of 1 or more and 50 or less; and if the formula contains two or more parts which are denoted by the same symbol, each of them may be the same or different from each other.

In the compound (H), it is preferable that $X^6$ in the structure represented by the formula (10) is —O—.

Also, it is preferable that a hydrocarbon having at least one C—C unsaturated bond in one molecule to be led or converted to the compound (H) is a butadiene polymer.

It is preferable that a hydrocarbon having at least one C—C unsaturated bond in one molecule to be led to the compound (H) is an isoprene polymer.

It is preferable that the polymerizable C—C unsaturated bond of the compound (H) is a (meth)acryl group.

The compound (H) is a reacted product of a homopolymer of diene compound such as polyisoprene, polybutadiene or the like having a hydroxyl group, a carboxyl group, a glycidyl group or the like or a copolymer of a diene compound and styrene or the like (a first component) and a compound having a functional group reactive to the hydroxyl group, the carboxyl group, the glycidyl group or the like of the polymer, a functional group having a polymerizable C—C unsaturated bond, and a repeating unit similar to the repeating unit ($X^1$—$R^1$) in the compound (B) (a second component). Herein, as a functional group having polymerizable C—C unsaturated bond contained in the second component, there may be a (meth)acryloyl group, a vinyl group, or a functional group represented by the formula (2). If a number average molecular weight of the compound (H) is less than 500, expected flexibility may not be exhibited, thus it is not preferable, and if the number average molecular weight is more than 5,000, viscosity becomes too high and it is not preferable for practical use.

A homopolymer of diene compound such as polyisoprene, polybutadiene or the like or a copolymer of a diene compound and styrene or the like are necessary to allow a cured product to exhibit flexibility, however, if these compound are used without modification, compatibility with the compound (B), a diluent or the like is not good so as to cause phase separation during curing. Therefore, in the present invention, modification is performed by reacting a homopolymer of diene compound such as polyisoprene, polybutadiene or the like having a hydroxyl group, a carboxyl group, a glycidyl group or the like or a copolymer of a diene compound and styrene or the like (a first component) with a compound having a functional group reactive to the hydroxyl group, the carboxyl group, the glycidyl group or the like of the polymer, a functional group having a polymerizable C—C unsaturated bond, and a repeating unit similar to the repeating unit used for the compound (B) (a second component) to improve uniformity of the whole system and to be taken in a cured product by the reaction, therefore, the present invention can provide cured products having similar morphology even reaction is performed quickly or for a long time in a oven or the like.

Specifically, for example, the following modified product may be used, which may be used solely or in combination:

(1) A compound obtained by reacting polybutadiene having a hydroxyl group with cyclohexane tetracarboxylic dianhydride of equimolar amount as the hydroxyl group, and thereafter, half esterifying it with polytetramethyleneglycol methacrylate having a hydroxyl group at the end position;

(2) A compound obtained by reacting a maleated polybutadiene with hexamethylene diamine of equimolar amount as residue of maleic acid, and thereafter, reacting it with maleic anhydride followed by cyclodehydration;

(3) A compound obtained by half esterifying maleated polybutadiene with polytetramethyleneglycol methacrylate having a hydroxyl group of equimolar amount as residue of maleic acid; and (4) A compound obtained by esterifying polybutadiene having a carboxyl group at the end position with polytetramethyleneglycol methacrylate.

In the present invention, a reactive diluent (I) may be added to a resin composition. As a diluent of the compound (B), a vinyl compound which is in liquid form can be used. It is preferable that the vinyl compound in liquid form is a compound having a (meth)acryloyl group from the viewpoint of copolymerization capability with the functional group represented by the formula (2) of the compound (B).

Such a compound, for example, single or plural kinds among alicyclic(meth)acrylic ester, aliphatic(meth)acrylic ester, aromatic(meth)acrylic ester, aliphatic dicarboxylic acid (meth)acrylic ester, aromatic dicarboxylic acid (meth)acrylic ester or the like can be used and may preferably have the same or less compounding amount as the compounds (E), if a resin composition contains the compounds (E).

As such a general reactive diluent, there may be methyl (meth)acrylate, ethyl(meth)acrylate, n-butyl(meth)acrylate, isobutyl(meth)acrylate, tert-butyl(meth)acrylate, isodecyl (meth)acrylate, lauryl(meth)acrylate, tridecyl(meth)acrylate, cetyl(meth)acrylate, stearyl(meth)acrylate, isoamyl(meth) acrylate, isostearyl(meth)acrylate, behenyl(meth)acrylate, 2-ethylhexyl(meth)acrylate, alkyl(meth)acrylate other than above, cyclohexyl(meth)acrylate, tert-butylcyclohexyl (meth)acrylate, tetrahydrofurfuryl(meth)acrylate, benzyl (meth)acrylate, phenoxyethyl(meth)acrylate, isobornyl (meth)acrylate, glycidyl(meth)acrylate, trimethylol propanetri(meth)acrylate, zinc mono(meth)acrylate, zinc di(meth)acrylate, dimethylaminoethyl(meth)acrylate, diethylaminoethyl(meth)acrylate, neopentylglycol(meth) acrylate, trifluoromethyl(meth)acrylate, 2,2,3,3-tetrafluoropropyl(meth)acrylate, 2,2,3,3,4,4-hexafluorobutyl(meth) acrylate, perfluorooctyl(meth)acrylate, perfluorooctylethyl (meth)acrylate, ethyleneglycol di(meth)acrylate, propyleneglycol di(meth)acrylate, 1,4-butanediol di(meth) acrylate, 1,6-hexanediol di(meth)acrylate, 1,9-nonandiol di(meth)acrylate, 1,3-butanediol di(meth)acrylate, 1,10-decanediol di(meth)acrylate, tetramethyleneglycol mono (meth)acrylate, tetramethyleneglycol di(meth)acrylate, methoxyethyl(meth)acrylate, butoxyethyl(meth)acrylate, ethoxydiethyleneglycol(meth)acrylate, methoxypolyalkyleneglycol mono(meth)acrylate, octoxypolyalkyleneglycol mono(meth)acrylate, lauroxypolyalkyleneglycol mono (meth)acrylate, stearoxypolyalkyleneglycol mono(meth) acrylate, allyloxypolyalkyleneglycol mono(meth)acrylate, nonylphenoxypolyalkyleneglycol mono(meth)acrylate, N,N'-methylene bis(meth)acrylic amide, N,N'-ethylene bis (meth)acrylic amide, 1,2-di(meth)acrylic amide ethyleneglycol, di(meth)acryloyloxymethyltricyclodecane, 2-(meth) acryloyloxyethyl succinate, 2-(meth)acryloyloxyethyl hexahydrophthalate, 2-(meth)acryloyloxyethyl, N-(meth) acryloyloxyethylmaleimide, N-(meth)acryloyloxyethylhexahydrophthal imide, N-(meth)acryloyloxyethylphthal imide or the like.

In the present invention, a silane coupling agent (J) can be used for the purpose of obtaining good adhesion. Particularly, a silane coupling agent having a S—S bond is preferably used together with silver powder (A) since not only adhesion strength to the parts to be bonded improves but also cohesion of a cured product of resin composition improves as the silane coupling agent also reacts with the silver powder, therefore, particularly excellent adhesion can be obtained.

As such a silane coupling agent having a S—S bond, there may be bis(trimethoxysilylpropyl)tetrasulfide, bis(triethoxysilylpropyl)tetrasulfide, bis(tributoxysilylpropyl)tetrasulfide, bis(dimethoxymethylsilylpropyl)tetrasulfide, bis(diethoxymethylsilylpropyl)tetrasulfide, bis (dibutoxymethylsilylpropyl)tetrasulfide, bis (trimethoxysilylpropyl)disulfide, bis(triethoxysilylpropyl) disulfide, bis(tributoxysilylpropyl)disulfide, bis (dimethoxymethylsilylpropyl)disulfide, bis (diethoxymethylsilylpropyl)disulfide, bis (dibutoxymethylsilylpropyl)disulfide, or the like.

Also, it is more preferable to use a silane coupling agent having a glycidyl group together with the silane coupling agent having an S—S bond. As the silane coupling agent having a glycidyl group, there may be 2-(3,4-epoxycyclohexyl)ethyltrimethoxy silane, 3-glycycloxypropyltrimethoxy silane, 3-glycycloxypropylmethyldiethoxy silane, 3-glycycloxypropyltriethoxy silane or the like.

In the present invention, it is also possible to add a compound (K) having a glycidyl group other than the above-mentioned coupling agent having a glycidyl group. Particularly, if good adhesion with a copper surface is required, the addition of the compound having a glycidyl group is effective. As the compound having a glycidyl group, there may be used one obtained by glycidyl etherifying bisphenol A, bisphenol F or other bisphenols, one obtained by glycidyl etherifying phenolnovolac, cresolnovolac or other phenols and an epoxy compound of aminophenol. For the purpose of decreasing viscosity, there may be aliphatic glycidyl ethers, glycidyl ethers in a form of an aliphatic ring produced by hydrogenation, alicyclic epoxy compound or the like, if required, imidazole or other compounds which react with a glycidyl group may be added. Particularly, in order to balance storage stability and reactivity, it is preferable to use an adduct of 2-methylimidazole and 2,4-diamino-6-vinyltriazine or 2-phenyl-4-methyl-5-hydroxymethylimidazole.

In the present invention, a combination of the following compound (L) and the following compound (M) may be further added to a resin composition:
Compound (L):

A compound (L) is a compound containing the following structure represented by the formula (11) in a main chain and having at least one glycidyl group:

Formula (11):

(11)

wherein $X^7$ is —O—, —COO— or —OCOO—; $R^{15}$ is a hydrocarbon group having 3 to 6 carbons; "u" is an integer of 2 or more and 50 or less; and if the formula contains two or more parts which are denoted by the same symbol, each of them may be the same or different from each other;
Compound (M):

A compound (M) is a compound having a functional group which can react with the glycidyl group of the compound (L).

The compound (L) having a glycidyl group limits the hydrocarbon group $R^{15}$ contained in a repeating unit in a main chain to a hydrocarbon group having 3 to 6 carbons since if $R^{15}$ has less carbon, deterioration of moisture resistivity of a cured product may occur and it causes deterioration of properties such as adhesion strength or the like under severe condition in water treatment such as PCT or the like. On the other hand, if $R^{15}$ has more carbons, hydrophobic property of a resin becomes too strong and adhesion strength to a metal surface or the like which is easily oxidized such as copper or the like may deteriorate.

The repeating unit contains —O—, —COO— or —OCOO— as a part represented by the symbol "$X^7$" since it is necessary to exhibit flexibility of a cured product and sufficient adhesion strength.

Also, the glycidyl group is necessary since introduction of a glycidyl group is effective in view of bonding to copper particularly. By introducing a glycidyl group, compatibility to various surfaces to be bonded can be improved.

Further, it is preferable that the repeating unit is the same as or similar to the repeating unit ($X^1$—$R^1$) of the compound (B) in order to improve uniformity of a resin composition, particularly uniformity after curing. If the repeating unit is not similar, separation proceeds particularly when curing is performed by an oven or the like for a long time so that properties of a cured product may not be sufficiently exhibited.

It is not preferable for practical use that the repeating number "u" becomes over 50 as viscosity rises. If the repeating unit satisfies the above condition, two or more kinds of such repeating units may be used or a copolymer with other component may be used.

As the compound (M) having a functional group reactive with the glycidyl group of the compound (L), a generally used curing agent of an epoxy resin may be used. For example, there may be phenol compounds, amine compounds, imidazole compounds or the like, but may not be limited.

In a resin composition of the present invention, additives such as a defoaming agent, a surfactant, various polymerization inhibitors, an oxidation inhibitor or the like may be used, if required.

A resin composition of the present invention may be produced by, for example, after preliminarily mixing each component, mixing with the use of a three-roll mill and defoaming under vacuum.

A method of producing a semiconductor device using a resin composition of the present invention may be conducted in conventional manners. For example, after dispensing a resin composition on a certain portion of a lead frame by means of a commercially available die bonder, a chip is mounted followed by heat-curing. Then, it is subject to wire-bonding and to transfer molding with the use of an epoxy molding compound, thereby, a semiconductor device is produced.

Hereafter, among various compositions which are combinations of essential components such as the filler (A), the compound (B) and the thermal radical initiator (C), and optional components, the following first to sixth composition systems are exemplified as particularly preferable.
(1) A First Composition System A first composition system is a composition comprising at least the filler (A), the compound (B), the thermal radical initiator (C) and the compound (D), and substantially not containing a photo polymerization initiator.

Among the first composition system, a composition which further contains one or more silane-based coupling agents (J) is also preferable.
(2) A Second Composition System A second composition system is a composition comprising at least the filler (A), the compound (B), the thermal radical initiator (C), the compound (D) and a combination of the compound (L) and the compound (M), and substantially not containing a photo polymerization initiator.

Among the second composition system, a composition which further contains one or more silane-based coupling agents (J) is also preferable.
(3) A Third Composition System A third composition system is a composition comprising at least the filler (A), the compound (B), the thermal radical initiator (C) and the acrylic ester compound (E), and substantially not containing a photo polymerization initiator.

Among the third composition system, a composition which further contains one or more silane-based coupling agents (J) is also preferable.
(4) A Forth Composition System A forth composition system is a composition comprising the filler (A), the compound (B), the thermal radical initiator (C) and the acrylamide compound (F), and substantially not containing a photo polymerization initiator.

Among the forth composition system, a composition which further contains one or more silane-based coupling agents (J) is also preferable.
(5) A Fifth Composition System A fifth composition system is a composition comprising the filler (A), the compound (B), the thermal radical initiator (C) and the allyl ester compound (G), and substantially not containing a photo polymerization initiator.

The fifth composition system preferably contains 20 to 60 wt % of the allyl ester compound (G) with respect to the total amount of the compound (B) and the allyl ester compound (G). If the ratio of the allyl ester compound (G) excessively increases, curability may deteriorate.

Among the fifth composition system, a composition which further contains one or more silane-based coupling agents (J) is also preferable.
(6) A Sixth Composition System A sixth composition system is a composition comprising the filler (A), the compound (B), the thermal radical initiator (C), the compound (H) and the reactive diluent (I), and substantially not containing a photo polymerization initiator.

Among the sixth composition system, a composition which further contains one or more silane-based coupling agents (J) is also preferable.

EXAMPLES

The following experimental examples further describe the above-mentioned first to sixth composition systems of the present invention.

Firstly, experimental examples of the first composition system (Experimental example series A) are hereinafter described. The compounding ratio is in "part by weight".

Examples A1 to A4

Comparative Examples A1 to A3

As the compound (B), polyether-based bismaleimide acetic ester (LUMICURE MIA-200, manufactured by DAINIPPON INK & CHEMICALS, INC., a compound wherein $R^2$ is —$C_2H_2$— and $R^3$ is —$CH_2$— in the formula (2), and $X^1$ is —O— and $R^1$ is —$C_4H_8$— in the formula (1), hereafter referred as "compound 1") was used. As the compound (D), polypropylene glycol dimethacrylate (BLEMMER PDP-400, manufactured by NOF Corporation, hereafter referred as "compound 2") and polytetramethylene glycol dimethacrylate (BLEMMER PDT-800, manufactured by NOF Corporation, hereafter referred as "compound 3") were used. As the thermal radical initiator (C), dicumyl peroxide (decomposition temperature: 126° C. in rapid heating test, Percumyl D, manufactured by NOF Corporation, hereafter referred as "initiator") was used. As the filler (A), silver powder in a flake-like form having an average particle size of 3 μm and a maximumparticle size of 20 μm (hereafter referred as "silver powder") was used. Also, lauryl acrylate (Light Ester LA, manufactured by KYOEISHA CHEMICAL Co., LTD., hereafter referred as "diluent") and a silane coupling agent having a methacryl group (KBM-503, manufactured by Shin-Etsu Chemical Co., Ltd., hereafter referred as "methacryl silane") were used.

These compounds were compounded in combination as shown in Table 1 and kneaded by means of the three-roll mill followed by defoaming, thus resin compositions were obtained.

In Comparative example A1, polyethylene glycol dimethacrylate (BLEMMER PDE-400, manufactured by NOF Corporation, hereafter referred as "compound 4") was used. In Comparative example A3, diglycidyl bisphenol A obtainable by reacting bisphenol A and epichlorohydrin (epoxy equivalent: 180, liquid at room temperature, hereafter referred as "bis-A-epoxy"), cresyl glycidyl ether (epoxy equivalent: 185, hereafter referred as "CGE"), phenol novolac resin (hydroxyl equivalent: 104, softening point: 85° C., hereafter referred as "PN"), 2-phenyl-4,5-dihydroxymethylimidazole (product name: Curezole, manufactured by Shikoku Chemicals Corporation, hereafter referred as "2PHZ") and a silane coupling agent having a glycidyl group (KBM-403E, manufactured by Shin-Etsu Chemical Co., Ltd., hereafter referred as "epoxy silane") were used.

The obtained resin compositions were evaluated in the following manner. The evaluation results are shown in Table 1.

TABLE 1

| | | Example | | | | Comparative example | | |
|---|---|---|---|---|---|---|---|---|
| | | A1 | A2 | A3 | A4 | A1 | A2 | A3 |
| Compound 1 | | 7.8 | 9.7 | 7.8 | 7.8 | 7.8 | | |
| Compound 2 | | | | | 11.7 | | | |
| Compound 3 | | 11.7 | 9.7 | 9.7 | | | 19.4 | |
| Compound 4 | | | | | | 11.7 | | |
| Diluent | | | | | 1.9 | | | |
| Initiator | | 0.4 | 0.4 | 0.4 | 0.4 | 0.4 | 0.4 | |
| Silver powder | | 80.0 | 80.0 | 80.0 | 80.0 | 80.0 | 80.0 | 75.0 |
| Bis-A-epoxy | | | | | | | | 16.1 |
| CGE | | | | | | | | 6.9 |
| PN | | | | | | | | 1.1 |
| 2PHZ | | | | | | | | 0.7 |
| Methacryl silane | | 0.2 | 0.2 | 0.2 | 0.2 | 0.2 | 0.2 | |
| Epoxy silane | | | | | | | | 0.2 |
| Viscosity | Initial value (Pa·s) | 18.4 | 20.4 | 16.4 | 17.8 | 16.8 | 15.4 | 21.6 |
| | After 48 hours (Pa·s) | 18.6 | 20.8 | 16.8 | 17.2 | 17.0 | 15.2 | 21.8 |
| | Viscosity increasing rate | 1% | 2% | 2% | −3% | 1% | −1% | 1% |
| Adhesion strength (N/chip) | 30 seconds curing (hot plate) After curing | 45 | 45 | 41 | 54 | 51 | 22 | 16 |
| | After PCT | 35 | 40 | 32 | 44 | 24 | 8 | 3 |
| | 60 minutes curing (oven) After curing | 50 | 52 | 48 | 50 | 48 | 31 | 37 |
| | After PCT | 34 | 38 | 33 | 34 | 20 | 15 | 18 |
| Soder crack resistance | Delaminated area (%) | <10 | <10 | <10 | <10 | 50< | 50< | 50< |
| Comprehensive evaluation | | ○ | ○ | ○ | ○ | x | x | x |

<Evaluation Method of Experimental Example Series A>
(1) Viscosity

Using an E type viscometer (3° cone), values were measured at 2.5 rpm at 25° C. just after producing a resin composition and after leaving for 48 hours at 25° C. A measured result having viscosity of 15 to 25 Pa·s just after production and viscosity increasing rate after 48 hours of less than 20% was evaluated to have passed the criteria. A unit of viscosity is "Pa·s" and a unit of viscosity increasing rate is "%".

(2) Adhesion Strength

A 6×6 mm silicon chip was mounted on a silver plated copper frame using the obtained resin composition and cured on a hot plate of 200° C. for 30 seconds and in an oven of 150° C. for 60 minutes respectively. After curing and PCT process (121° C., 100%, 72 hours), hot die shear strength at 260° C. was measured by means of the automatic adhesion strength tester. A measured result having hot die shear strength at 260° C. of 30 N/chip or more was evaluated to have passed the criteria. A unit of adhesion strength is "N/chip".

(3) Solder Crack Resistance

The following lead frame and the following silicon chip were bonded by curing under the following curing condition using the obtained resin compositions followed by molding by an epoxy molding compound (Sumikon EME-7026, manufactured by Sumitomo Bakelite Company Limited). The package was subject to a moisture absorption treatment for 192 hours in an atmosphere of 60° C. and 60% relative humidity, and then to an IR reflow treatment (260° C., 10 seconds, three times of reflow). Then, the degree of delamination of packages after the treatments was measured by means of the scanning acoustic microscope detector (through scan mode). A measured result having a delaminated area of a die attach portion of less than 10% was evaluated to have passed the criteria. A unit of delaminated area is "%".

Package: QFP (14×20×2.0 mm)
Lead frame: silver spot plated copper frame
Chip size: 6×6 mm
Curing condition of a resin composition: a hot plate at 200° C. for 60 seconds Next, experimental examples of the second composition system (Experimental example series B) are hereinafter described. The compounding ratio is in "part by weight".

Examples B1 to B4

Comparative Examples B1 to B4

As the compound (B), polyether-based bismaleimide acetic ester (LUMICURE MIA-200, manufactured by DAINIPPON INK & CHEMICALS, INC., a compound wherein $R^2$ is $—C_2H_2—$ and $R^3$ is $—CH_2—$ in the formula (2), and $X^1$ is $—O—$ and $R^1$ is $—C_4H_8—$ in the formula (1), hereafter referred as "compound 1") was used. As the compound (D), polypropylene glycol dimethacrylate (BLEMMER PDP-400, manufactured by NOF Corporation, hereafter referred as "compound 2") and polytetramethylene glycol dimethacrylate (BLEMMER PDT-800, manufactured by NOF Corporation, hereafter referred as "compound 3") were used. As the compound (L) containing a glycidyl group, polytetramethylene glycol diglycidyl ether (ED-612, manufactured by Asahi Denka Co., Ltd., hereafter referred as "compound 4") and polypropylene glycol diglycidyl ether (ED-506, manufactured by Asahi Denka Co., Ltd., hereafter referred as "compound 5") were used. As the compound (M) which reacts with a glycidyl group, 2-phenyl-4,5-dihydroxymethylimidazole (product name: Curezole, manufactured by Shikoku Chemicals Corporation, hereafter referred as "2PHZ") was used. As the thermal radical initiator (C), dicumyl peroxide (decomposition temperature: 126° C. in rapid heating test, Percumyl D, manufactured by NOF Corporation, hereafter referred as "initiator") was used. As the filler (A), silver powder in a flake-like form having an average particle size of 3 μm and a maximum particle size of 20 μm (hereafter referred as "silver powder") was used. Also, lauryl acrylate (Light Ester LA, manufactured by KYOEISHA CHEMICAL Co., LTD., hereafter referred as "diluent"), a silane coupling agent having a methacryl group (KBM-503, manufactured by Shin-Etsu Chemical Co., Ltd., hereafter referred as "methacryl silane") and a silane coupling agent having a glycidyl group (KBM-403E, manufactured by Shin-Etsu Chemical Co., Ltd., hereafter referred as "epoxy silane") were used.

These compounds were compounded as shown in Table 2 and kneaded by means of the three-roll mill followed by defoaming, thus obtained resin compositions.

In Comparative examples B1 and B2, polyethylene glycol dimethacrylate (BLEMMER PDE-400, manufactured by NOF Corporation, hereafter referred as "compound 6") was used. In Comparative example B4, diglycidyl bisphenol A obtained by reacting bisphenol A and epichlorohydrin (epoxy equivalent: 180, liquid at room temperature, hereafter referred as "bis-A-epoxy"), cresyl glycidyl ether (epoxy equivalent: 185, hereafter referred as "CGE") and phenol novolac resin (hydroxyl equivalent: 104, softening point: 85° C., hereafter referred as "PN") were used.

The obtained resin compositions were evaluated in the following manner. The evaluation results are shown in Table 2.

TABLE 2

| | | | Example | | | | Comparative example | | | |
|---|---|---|---|---|---|---|---|---|---|---|
| | | | B1 | B2 | B3 | B4 | B1 | B2 | B3 | B4 |
| Compound 1 | | | 5.8 | 5.8 | 5.8 | 5.8 | 5.8 | 7.7 | | |
| Compound 2 | | | | 5.8 | 5.8 | | | | | |
| Compound 3 | | | 11.6 | 5.8 | 5.8 | 9.6 | | | 17.4 | |
| Compound 4 | | | 1.9 | 1.9 | | 1.9 | 1.9 | | 1.9 | |
| Compound 5 | | | | | 1.9 | | | | | |
| Compound 6 | | | | | | | 11.6 | 11.6 | | |
| Diluent | | | | | | 1.9 | | | | |
| Initiator | | | 0.4 | 0.4 | 0.4 | 0.4 | 0.4 | 0.4 | 0.4 | |
| Silver powder | | | 80.0 | 80.0 | 80.0 | 80.0 | 80.0 | 80.0 | 80.0 | 75.0 |
| Bis-A-epoxy | | | | | | | | | | 16.1 |
| CGE | | | | | | | | | | 6.9 |
| PN | | | | | | | | | | 1.1 |
| 2PHZ | | | 0.1 | 0.1 | 0.1 | 0.1 | 0.1 | 0.1 | 0.1 | 0.7 |
| Methacryl silane | | | 0.2 | 0.2 | 0.2 | 0.2 | 0.2 | 0.2 | 0.2 | |
| Epoxy silane | | | 0.06 | 0.06 | 0.06 | 0.06 | 0.06 | 0.06 | 0.06 | 0.23 |
| Viscosity | Initial value (Pa · s) | | 19.6 | 18.0 | 17.2 | 15.4 | 16.0 | 18.6 | 15.8 | 21.6 |
| | After 48 hours (Pa · s) | | 20.0 | 18.4 | 17.8 | 15.6 | 15.8 | 18.4 | 16.0 | 21.8 |
| | Viscosity increasing rate | | 2% | 2% | 3% | 1% | −1% | −1% | 1% | 1% |
| Adhesion strength (N/chip) | 30 seconds curing (hot plate) | After curing | 50 | 52 | 48 | 54 | 50 | 12 | 8 | 22 |
| | | After PCT | 46 | 45 | 44 | 48 | 22 | 2 | 1 | 5 |
| | 60 minutes curing (oven) | After curing | 56 | 54 | 50 | 54 | 52 | 8 | 10 | 56 |
| | | After PCT | 42 | 40 | 42 | 44 | 25 | 1 | 2 | 20 |
| Soder crack resistance | Delaminated area (%) | | <10 | <10 | <10 | <10 | 50< | 50< | 50< | 50< |
| Comprehensive evaluation | | | ○ | ○ | ○ | ○ | x | x | x | x |

<Evaluation Method of Experimental Example Series B>
(1) Viscosity

Using an E type viscometer (3° cone), values were measured at 2.5 rpm at 25° C. just after producing a resin composition and after leaving for 48 hours at 25° C. A measured result having viscosity of 15 to 25 Pa·s just after production and viscosity increasing rate after 48 hours of less than 20% was evaluated to have passed the criteria. A unit of viscosity is "Pa·s" and a unit of viscosity increasing rate is "%".

(2) Adhesion Strength

A 6×6 mm silicon chip was mounted on a ring plated copper frame (silver plated only on inner lead part) using the obtained resin compositions and cured on a hot plate of 200° C. for 30 seconds and in an oven of 150° C. for 60 minutes respectively. After curing and PCT process (121° C., 100%, 72 hours), hot die shear strength at 260° C. was measured by means of the automatic adhesion strength tester. A measured result having hot die shear strength at 260° C. of 30 N/chip or more was evaluated to have passed the criteria. A unit of adhesion strength is "N/chip".

(3) Solder Crack Resistance

The following lead frame and the following silicon chip were bonded by curing under the following curing condition with the use of the obtained resin compositions followed by molding by an epoxy molding compound (Sumikon EME-7026, manufactured by Sumitomo Bakelite Company Limited). The package was subject to a moisture absorption treatment for 192 hours in an atmosphere of 60° C. and 60% relative humidity, and then to an IR reflow treatment (260° C., 10 seconds, three times of reflow). Then, the degree of delamination of packages after the treatments was measured by means of the scanning acoustic microscope detector (through scan mode). A measured result having a delaminated area of a die attach portion of less than 10% was evaluated to have passed the criteria. A unit of delaminated area is "%".

Package: QFP (14×20×2.0 mm)
Lead frame: ring plated copper frame (silver plated only on inner lead part)
Chip size: 6×6 mm
Curing condition of a resin composition: a hot plate at 200° C. for 60 seconds Next, experimental examples of the third composition system (Experimental example series C) are hereinafter described. The compounding ratio is in "part by weight".

Example C1 to C4

(1) Synthesis of a Maleimide of Amino Acid (1-1) Maleimide Acetic Acid

After 120 g of maleic anhydride and 500 g of toluene were charged in a separable flask and refluxed for one hour while stirring to remove moisture in the system by means of the Dean-Stark trap, the flask was cooled to room temperature followed by dropping a liquid wherein 75 g of glycine (aminoacetic acid) was solved in 200 g of acetonitrile in the flask placed in an ice bath for 60 minutes while introducing dry nitrogen, and then the liquid was stirred at room temperature for 23 hours.

Next, the liquid was stirred under reflux for 8 hours while removing the generated moisture by the Dean-Stark trap. The obtained liquid phase was subject to separation for washing using pure water for 5 times followed by removing a solvent using the evaporator and the vacuum dryer, thus obtained a product. The obtained product was brown crystal and had yield of about 150 g. Formation of maleimide groups was confirmed by NMR and IR.

(1-2) Maleimide Caproic Acid

After 120 g of maleic anhydride and 500 g of toluene were charged in a separable flask and refluxed for one hour while stirring to remove moisture in the system by means of the Dean-Stark trap, the flask was cooled to room temperature followed by dropping a liquid wherein 131 g of 6-aminocaproic acid was solved in 200 g of acetonitrile in the flask placed in an ice bath for 60 minutes while introducing dry nitrogen, and then the liquid was stirred at room temperature for 23 hours.

Next, the liquid was stirred under reflux for 8 hours while removing the generated moisture by the Dean-Stark trap. The obtained liquid phase was subject to separation for washing using pure water for 5 times followed by removing a solvent using the evaporator and the vacuum dryer, thus obtained a product. The obtained product was brown crystal and had yield of about 195 g. Formation of maleimide groups was confirmed by NMR and IR.

(2) Reaction of a Maleimide of Amino Acid and Diol (2-1) Reaction of Maleimide Acetic Acid and Polypropylene Glycoldiol After 62 g of maleimide acetic acid synthesized in (1-1), 90 g of polypropylene glycoldiol (repeating number of about 7, Uniol D-400, manufactured by NOF Corporation), 500 g of toluene and 3.4 g of paratoluene sulfonic acid were charged in a separable flask and refluxed for 16 hours while stirring. The generated moisture was removed outside the system by the Dean-Stark trap. After reaction, the obtained liquid phase was subject to separation for washing using 70° C. distilled water for 3 times and distilled water at room temperature for 2 times. The obtained solvent layer was dried using the evaporator and the vacuum dryer, thus obtained a product. The obtained product was brown liquid and had yield of about 130 g. Formation of ester bonds and disappearance of carboxyl groups were confirmed by NMR and IR. The obtained product is a bismaleimide compound (B') represented by the formula (3) wherein $X^2$ is —O—, $R^4$ is —H, $R^5$ has 1 carbon, $R^6$ has 3 carbons and "n" is about 6, which is hereafter referred as "compound B1".

(2-2) Reaction of Maleimide Acetic Acid and Polybutylene Glycoldiol

After 62 g of maleimide acetic acid synthesized in (1-1), 110 g of polybutylene glycoldiol (repeating number of about 7, Uniol PB-500, manufactured by NOF Corporation), 500 g of toluene and 3.4 g of paratoluene sulfonic acid were charged in a separable flask and obtained a product similarly as (2-1). The obtained product was brown liquid and had yield of about 150 g. Formation of ester bonds and disappearance of carboxyl groups were confirmed by NMR and IR. The obtained product is a bismaleimide compound (B') represented by the formula (3) wherein $X^2$ is —O—, $R^4$ is —H, $R^5$ has 1 carbon, $R^6$ has 4 carbons and "n" is about 6, which is hereafter referred as "compound B2".

(2-3) Reaction of Maleimide Caproic Acid and Polypropylene Glycoldiol

After 84 g of maleimide caproic acid synthesized in (1-2), 90 g of polypropylene glycoldiol (repeating number of about 7, Uniol D-400, manufactured by NOF Corporation), 500 g of toluene and 3.4 g of paratoluene sulfonic acid were charged in a separable flask and obtained a product similarly as (2-1). The obtained product was brown liquid and had yield of about 150 g. Formation of ester bonds and disappearance of carboxyl groups were confirmed by NMR and IR. The obtained product is a bismaleimide compound (B') represented by the formula (3) wherein $X^2$ is —O—, $R^4$ is —H, $R^5$ has 5 carbons, $R^6$ has 3 carbons and "n" is about 6, which is hereafter referred as "compound B3".

(2-4) Reaction of Maleimide Caproic Acid and Polybutylene Glycoldiol

After 84 g of maleimide caproic acid synthesized in (1-2), 110 g of polybutylene glycoldiol (repeating number of about 7, Uniol PB-500, manufactured by NOF Corporation), 500 g of toluene and 3.4 g of paratoluene sulfonic acid were charged in a separable flask and obtained a product similarly as (2-1). The obtained product was brown liquid and had yield of about 167 g. Formation of ester bonds and disappearance of carboxyl groups were confirmed by NMR and IR. The obtained product is a compound represented by the formula (3) wherein $X^2$ is —O—, $R^4$ is —H, $R^5$ has 5 carbons, $R^6$ has 4 carbons and "n" is about 6, which is hereafter referred as "compound B4".

(3) Reaction of Acrylic Acid and Polybutylene Glycoldiol

After 35 g of acrylic acid, 104 g of polybutylene glycoldiol (repeating number of about 7, Uniol PB-500, manufactured by NOF Corporation), 500 g of toluene and 3.4 g of paratoluene sulfonic acid were charged in a separable flask and refluxed for 16 hours while stirring. The generated moisture was removed outside the system by the Dean-Stark trap. After reaction, the obtained liquid phase was subject to separation for washing using 70° C. distilled water for 3 times and distilled water at room temperature for 2 times. The obtained solvent layer was dried using the evaporator and the vacuum dryer, thus obtained a product. The obtained product was light brown liquid and had yield of about 120 g. Formation of ester bonds and disappearance of carboxyl groups were confirmed by NMR and IR. The obtained product is hereafter referred as "compound X".

As the filler (A), silver powder in a flake-like form having an average particle size of 8 μm and a maximum particle size of 30 μm (hereafter referred to as "silver powder") was used. As the compound (B), the compounds B1 to B4 were used. As the acrylic ester compound (E), 2-hydroxypropyl methacrylate (the formula (5) wherein $R^9$ is a methyl group, $R^9$ is a methyl group, x=1, y=1 and z=1, Light Ester HOP, manufactured by KYOEISHA CHEMICAL Co., LTD., hereafter referred as "compound E1") and glycerol dimethacrylate (the formula (5) wherein $R^8$ is a methyl group, x=2, y=1 and z=0, Light Ester G-101P, manufactured by KYOEISHA CHEMICAL Co., LTD., hereafter referred as "compound E2") were used. As the thermal radical initiator (C), dicumyl peroxide (decomposition temperature: 126° C. in rapid heating test, Percumyl D, manufactured by NOF Corporation, hereafter referred as "initiator") was used.

Also, the compound X was used, and as silane coupling agents, a silane coupling agent having a tetrasulfide bond (A-1289, manufactured by Nippon Unicar Company Limited, hereafter referred as "coupling agent 1") and a silane coupling agent having a glycidyl group (KBM-403E, manufactured by Shin-Etsu Chemical Co., Ltd., hereafter referred as "coupling agent 2") were used.

These compounds were compounded in combination as shown in Table 3 and kneaded by means of the three-roll mill followed by defoaming, thus a resin composition was obtained.

Example C5

As a vinyl compound in liquid form, the compound X was used.

Example C6

As a compound having a glycidyl group, diglycidyl bisphenol A obtainable by reacting bisphenol A and epichlorohydrin (epoxy equivalent: 180, liquid at room temperature, hereafter referred as "compound Y1") and a reacted product of 2-methylimidazole and 2,4-diamino-6-vinyltriazine (product name: Curezole 2MZ-A, manufactured by Shikoku Chemicals Corporation, hereafter referred as "compound Y2") were used.

Comparative Examples C1 and C2

Each of the compounds is compounded in ratio as shown in Table 3, thus obtained resin compositions similarly to Example C1.

Comparative Example C3

1,6-Hexandiol dimethacrylate (Light Ester 1, 6HX, manufactured by KYOEISHA CHEMICAL Co., LTD., hereafter referred as "compound Z1") was used.

Comparative Example C4

2,2-bis[4-(4-maleimidephenoxy)phenyl]propane (BMI-80, manufactured by K•I CHEMICAL INDUSTRY CO., LTD.) was used. As BMI-80 is in solid form, BMI-80 and dimethylformamide (DMF) were mixed by weight ratio of 1:1 and used in solution form (hereafter referred as "compound Z2").

The obtained resin compositions were evaluated in the following manner. The evaluation results are shown in Table 3.

TABLE 3

|  | Example | | | | | | Comparative example | | | |
| --- | --- | --- | --- | --- | --- | --- | --- | --- | --- | --- |
|  | C1 | C2 | C3 | C4 | C5 | C6 | C1 | C2 | C3 | C4 |
| Silver powder | 80.0 | 80.0 | 80.0 | 80.0 | 80.0 | 80.0 | 80.0 | 80.0 | 80.0 | 80.0 |
| Compound B1 | 11.54 | | | | | 9.60 | | | 11.54 | |
| Compound B2 | | 11.54 | | | 9.62 | | | | | |
| Compound B3 | | | 11.54 | | | | | | | |
| Compound B4 | | | | 11.54 | | | | | | |
| Compound Z2 | | | | | | | | | | 14.63 |
| Compound E1 | 3.85 | 3.85 | 3.85 | 3.85 | 1.92 | 3.20 | 9.62 | 3.77 | | 2.44 |
| Compound E2 | 3.85 | 3.85 | 3.85 | 3.85 | 1.92 | 3.20 | 9.62 | 3.77 | | 2.44 |
| Compound Z1 | | | | | | | | | 7.69 | |
| Compound X | | | | | 5.77 | | | | | |

TABLE 3-continued

|  |  |  | Example | | | | | | Comparative example | | | |
|---|---|---|---|---|---|---|---|---|---|---|---|---|
|  |  |  | C1 | C2 | C3 | C4 | C5 | C6 | C1 | C2 | C3 | C4 |
| Initiator |  |  | 0.38 | 0.38 | 0.38 | 0.38 | 0.38 | 0.32 | 0.38 | 0.19 | 0.38 | 0.24 |
| Compound Y1 |  |  |  |  |  |  |  | 3.20 |  | 11.32 |  |  |
| Compound Y2 |  |  |  |  |  |  |  | 0.16 |  | 0.57 |  |  |
| Coupling agent 1 |  |  | 0.29 | 0.29 | 0.29 | 0.29 | 0.29 | 0.24 | 0.29 | 0.28 | 0.29 | 0.18 |
| Coupling agent 2 |  |  | 0.10 | 0.10 | 0.10 | 0.10 | 0.10 | 0.08 | 0.10 | 0.09 | 0.10 | 0.06 |
| Adhesion strength silver spot | After curing | N/chip | 50 | 50 | 48 | 52 | 50 | 46 | 10 | 40 | 42 | 32 |
|  | After moisture absorbtion | N/chip | 40 | 45 | 45 | 46 | 44 | 41 | 2 | 20 | 35 | 24 |
| Adhesion strength silver ring | After curing | N/chip | 40 | 42 | 41 | 40 | 40 | 44 | 5 | 62 | 34 | 23 |
|  | After moisture absorbtion | N/chip | 34 | 35 | 38 | 35 | 38 | 40 | 3 | 28 | 30 | 18 |
| Adhesion strength Ni—Pd | After curing | N/chip | 44 | 50 | 44 | 46 | 48 | 46 | 15 | 30 | 40 | 35 |
|  | After moisture absorbtion | N/chip | 40 | 42 | 39 | 44 | 42 | 40 | 2 | 18 | 32 | 22 |
| Bleeding | Silver spot | μm | <10 | <10 | <10 | <10 | <10 | <10 | <10 | 50 | 50 | <10 |
|  | Silver ring | μm | 20 | 20 | 20 | 20 | 40 | <10 | 20 | 20 | 100 | <10 |
|  | Ni—Pd | μm | 30 | 30 | 30 | 30 | 30 | 40 | 20 | 100 | 300 | <10 |
| Temperature cycle resistance | After curing | % | <10 | <10 | <10 | <10 | <10 | <10 | 50< | <10 | <10 | 20 |
| Delaminated area | After moisture absorbtion | % | <10 | <10 | <10 | <10 | <10 | <10 | 50< | 50< | <10 | 50< |
| Warpage |  | μm | <20 | <20 | <20 | <20 | <20 | <20 | <20 | 30 | <20 | 50 |
| Reflow resistance | Delaminated area | % | <10 | <10 | <10 | <10 | <10 | <10 | 50< | 50< | <10 | 50< |
| Comprehensive evaluation |  |  | ○ | ○ | ○ | ○ | ○ | ○ | x | x | x | x |

<Evaluation Method of Experimental Example Series C>
(1) Adhesion Strength

A 6×6 mm silicon chip was mounted on a copper frame using the obtained resin composition and cured in an oven of 150° C. for 30 minutes. Three kinds of copper frames were used, namely, silver spot plating (silver plated on a die pad portion), silver ring plating (die pad portion is made of copper) and Ni—Pd/Au plating. After curing and the moisture absorption treatment (85° C., 85%, 72 hours), hot die shear strength at 260° C. was measured by means of the automatic adhesion strength tester. A measured result having hot die shear strength at 260° C. of 30 N/chip or more was evaluated to have passed the criteria. A unit of adhesion strength is "N/chip".

(2) Bleeding

Bleeding of the cured products was observed by means of the optical microscope before the above-mentioned adhesion strength measurement. The maximum length of bleeding on each test piece was defined as bleeding. A measured result having bleeding length of 50 μm or less was evaluated to have passed the criteria. A unit of bleeding is "μm".

(3) Temperature Cycle Resistance

A 15×15×0.5 mm silicon chip was mounted on a Ni plated copper heat spreader using the obtained resin compositions and cured in an oven of 150° C. for 30 minutes. After curing and the temperature cycle process (−65° C.↔150° C., 100 cycles), delamination was measured by means of the scanning acoustic microscope detector (through scan mode). A measured result having delaminated area of less than 10% was evaluated to have passed the criteria. A unit of delaminated area is "%".

(4) Warpage and Reflow Resistance

The following substrate (lead frame) and the following silicon chip were bonded by curing at 150° C. for 30 minutes using resin compositions shown in Table 3. After curing, warpage of 10 mm on diagonal of chip surface was measured by means of the surface roughness meter. A unit of warpage is "μm". A measured result having warpage of 20 μm or less was evaluated to have passed the criteria. Also, similarly die bonded lead frame was molded using a molding compound (Sumikon EME-7026, manufactured by Sumitomo Bakelite Company Limited). The package was subject to a moisture absorption treatment for 192 hours in an atmosphere of 85° C. and 60% relative humidity, and then to an IR reflow treatment (260° C., 10 seconds, three times of reflow). The degree of delamination after the treatments was measured by means of the scanning acoustic microscope detector (through scan mode). A measured result having a delaminated area of a die attach portion of less than 10% was evaluated to have passed the criteria. A unit of delaminated area is "%".

Package: QFP (14×20×2.0 mm)
Lead frame: silver spot plated copper frame
Chip size: 9×9 mm
Curing condition of a resin composition: in an oven at 150° C. for 30 minutes Next, experimental examples of the forth composition system (Experimental example series D) are hereinafter described. The compounding ratio is in "part by weight".

Examples D1, D2 and D3

(1) Preparation of Compound (1)

67 g of polytetramethylene glycoldiol (repeating unit number of about 9 measured by NMR, PTMG650, manufactured by Mitsubishi Chemical Corporation) and 24 g of succinic anhydride (reagent) were stirred with a mixed solvent of acetonitrile/toluene (weight ratio 1:3) under reflux for four hours followed by separation for washing using ion-exchange water for 5 times. After collecting the acetonitrile/toluene layer, dehydration by means of the Dean-Stark trap under reflux and cooling to room temperature, 25 g of 2-hydroxylethylacrylamide (HEAA, manufactured by Kohjin Co., Ltd., hereafter referred as "HEAA") was added followed by dropping dicyclocarbodiimide/dimethylaminopyridine in ethyl acetate solution while stirring. After dropping, reaction was performed at room temperature for 16 hours.

After reaction, separation for washing was performed using ion-exchange water for 5 times. Thereafter, the organic solvent layer was filtrated to remove solid content followed by removing a solvent using the evaporator and the vacuum dryer, thus obtained a compound. The obtained compound was used for the following tests and referred hereafter as "compound (1)". The obtained compound had yield of about 85% and a styrene standard molecular weight by GPC of about 1,000. The compound (1) is a compound wherein $X^4$ is —O— and $R^{10}$ has 4 carbons and the repeating number of about 9 in the formula (6), and $R^{11}$ is —H in the formula (7).

(2) Preparation of Compound (2)

70 g of polytetrbutylene glycoldiol (average molecular weight of 700, Uniol PB-700, manufactured by NOF Corporation) and 24 g of succinic anhydride (reagent) were stirred with a mixed solvent of acetonitrile/toluene (weight ratio 1:3) under reflux for four hours followed by separation for washing using ion-exchange water for 5 times. After collecting the acetonitrile/toluene layer, dehydration by means of the Dean-Stark trap under reflux and cooling to room temperature, 25 g of 2-hydroxylethylacrylamide (HEAA, manufactured by Kohjin Co., Ltd., hereafter referred as "HEAA") was added followed by dropping dicyclocarbodiimide/dimethylaminopyridine in ethyl acetate solution while stirring. After dropping, reaction was performed at room temperature for 16 hours.

After reaction, separation for washing was performed using ion-exchange water for 5 times. Thereafter, the organic solvent layer was filtrated to remove solid content followed by removing a solvent using the evaporator and the vacuum dryer, thus obtained a compound. The obtained compound was used for the following tests and referred hereafter as "compound (2)". The obtained compound had yield of about 87%, production of ester was confirmed by NMR and IR and styrene standard molecular weight by GPC was about 1,000. The compound (2) is a compound wherein $X^4$ is —O— and $R^{10}$ has 4 carbons and the repeating number of about 9 in the formula (6), and $R^{11}$ is —H in the formula (7).

As the acrylamide compound (F), the above-mentioned compound (1) and compound (2) were used. As the compound (B), polyether-based bismaleimide acetic ester (LUMICURE MIA-200, manufactured by DAINIPPON INK & CHEMICALS, INC., a compound wherein $R^2$ is —$C_2H_2$— and $R^3$ is —$CH_2$— in the formula (2), and $X^1$ is —O— and $R^1$ is —$C_4H_8$— in the formula (1), hereafter referred as "compound (3)") was used. As the reactive diluent (I), lauryl acrylate (Light Ester LA, manufactured by KYOEISHA CHEMICAL Co., LTD., hereafter referred as "diluent") was used. As the thermal radical initiator (C), dicumyl peroxide (decomposition temperature: 126° C. in rapid heating test, Percumyl D, manufactured by NOF Corporation, hereafter referred as "initiator") was used. As the silane coupling agent, a silane coupling agent having a tetrasulfide bond (A-1289, manufactured by Nippon Unicar Company Limited, hereafter referred as "coupling agent 1") and a silane coupling agent having a glycidyl group (KBM-403E, manufactured by Shin-Etsu Chemical Co., Ltd., hereafter referred as "coupling agent 2") were used. As the filler (A), silver powder in a flake-like form having an average particle size of 5 μm and a maximum particle size of 30 μm (hereafter referred as "silver powder") was used.

These components were compounded in combination as shown in Table 4 and kneaded by means of the three-roll mill followed by defoaming, thus resin compositions were obtained. The compounding ratio is in "part by weight".

Comparative Examples D1 and D2

Each component was compounded in ratio as shown in Table 4, and similarly to Example D1, resin compositions were obtained. In Comparative example D1, diacrylate of tetramethyleneoxide (NK ester A-PTMG 65, manufactured by SHIN-NAKAMURA CHEMICAL CO., LTD., hereafter referred as "compound (4)") was used.

The obtained resin compositions were evaluated in the following manner. The evaluation results are shown in Table 4.

TABLE 4

|  |  |  | Example | | | Comparative example | |
| --- | --- | --- | --- | --- | --- | --- | --- |
|  |  |  | D1 | D2 | D3 | D1 | D2 |
| Silver powder |  |  | 85.00 | 85.00 | 85.00 | 85.00 | 85.00 |
| Compound (1) |  |  | 5.74 |  |  | 5.74 |  |
| Compound (2) |  |  |  | 5.74 | 5.74 |  |  |
| Compound (3) |  |  | 4.31 | 4.31 |  | 4.31 |  |
| Compound (4) |  |  |  |  |  | 5.74 | 11.48 |
| LA |  |  | 4.31 | 4.31 | 2.87 | 4.31 | 2.87 |
| Initiator |  |  | 0.29 | 0.29 | 0.29 | 0.29 | 0.29 |
| Coupling agent 1 |  |  | 0.29 | 0.29 | 0.29 | 0.29 | 0.29 |
| Coupling agent 2 |  |  | 0.07 | 0.07 | 0.07 | 0.07 | 0.07 |
| Adhesion strength | After curing | N/chip | 64 | 62 | 58 | 48 | 35 |
|  | After moisture absorbtion | N/chip | 56 | 58 | 42 | 35 | 20 |
| Warpage |  | μm | <20 | <20 | <20 | <20 | <20 |
| Reflow resistance | Delaminated area | % | <10 | <10 | <10 | 20 | 100 |
| Comprehensive evaluation |  |  | ○ | ○ | ○ | x | x |

<Evaluation Method of Experimental Example Series D>
(1) Adhesion Strength

A 6×6 mm silicon chip was mounted on a silver plated copper frame using the obtained resin compositions and cured in an oven of 150° C. for 15 minutes. After curing and the moisture absorption treatment (85° C., 85%, 72 hours), hot die shear strength at 260° C. was measured by means of the automatic adhesion strength tester. A measured result having hot die shear strength at 260° C. of 30 N/chip or more was evaluated to have passed the criteria. A unit of adhesion strength is "N/chip".

(2) Warpage and Reflow Resistance

The following substrate (lead frame) and the following silicon chip were bonded by curing at 150° C. for 15 minutes using resin compositions shown in Table 4. After curing, warpage of 10 mm on diagonal of chip surface was measured by means of the surface roughness meter. A unit of warpage is "μm". A measured result having warpage of 20 μm or less was evaluated to have passed the criteria. Also, similarly die bonded lead frame was molded using a molding compound (Sumikon EME-7026, manufactured by Sumitomo Bakelite Company Limited). The package was subject to a moisture absorption treatment for 192 hours in an atmosphere of 85° C. and 60% relative humidity, and then to an IR reflow treatment (260° C., 10 seconds, three times of reflow). The degree of delamination after the treatments was measured by means of the scanning acoustic microscope detector (through scan mode). A measured result having a delaminated area of a die attach portion of less than 10% was evaluated to have passed the criteria. A unit of delaminated area is "%".

Package: QFP (14×20×2.0 mm)
Lead frame: silver spot plated copper frame
Chip size: 9×9 mm
Curing condition of a resin composition: in an oven at 150° C. for 30 minutes Next, experimental examples of the fifth composition system (Experimental example series E) are hereinafter described. The compounding ratio is in "part by weight".

Examples E1, E2 and E3

As the compound (B), polyether-based bismaleimide acetic ester (LUMICURE MIA-200, manufactured by DAINIP- PON INK & CHEMICALS, INC., a compound wherein $R^2$ is —$C_2H_2$— and $R^3$ is —$CH_2$— in the formula (2), and $X^1$ is —O— and $R^1$ is —$C_4H_8$— in the formula (1), hereafter referred as "compound 1") was used. As the allyl ester compound (G), an allyl ester compound (allyl ester resin DA101, manufactured by Showa, a compound wherein $R^{13}$ is a cyclohexane group in the formula (9), hereafter referred as "compound 2") was used. As the filler (A), silver powder in a flake-like form having an average particle size of 5 μm and a maximum particle size of 30 μm (hereafter referred as "silver powder") was used. As the thermal radical initiator (C), dicumyl peroxide (decomposition temperature: 126° C. in rapid heating test, Percumyl D, manufactured by NOF Corporation, hereafter referred as "initiator") was used. Also, a silane coupling agent having a methacryl group (KBM-503, manufactured by Shin-Etsu Chemical Co., Ltd., hereafter referred as "methacryl silane") was used.

These components were compounded in combination as shown in Table 5 and kneaded by means of the three-roll mill followed by defoaming, thus resin compositions were obtained. The compounding ratio is in "part by weight".

Comparative Example E1

Each component was compounded in ratio as shown in Table 5, and similarly to Example E1, a resin composition was obtained.

The obtained resin composition was evaluated in the following manner. The evaluation result is shown in Table 5.

TABLE 5

|  |  |  | Example | | | Comparative example |
|---|---|---|---|---|---|---|
|  |  |  | E1 | E2 | E3 | E1 |
| Silver powder |  |  | 80.00 | 80.00 | 80.00 | 80.00 |
| Compound 1 |  |  | 14.56 | 11.65 | 8.74 |  |
| Compound 2 |  |  | 4.85 | 7.77 | 10.68 | 19.42 |
| Initiator |  |  | 0.39 | 0.39 | 0.39 | 0.39 |
| Methacryl silane |  |  | 0.19 | 0.19 | 0.19 | 0.19 |
| Adhesion strength 1 | After curing | N/chip | 55 | 55 | 50 | 20 |
| Adhesion strength 2 | After curing | N/chip | 60 | 62 | 60 | 18 |
| Warpage |  | μm | <20 | <20 | <20 | <20 |
| Reflow resistance | Delaminated area | % | <10 | <10 | <10 | 100 |
| Comprehensive evaluation |  |  | ○ | ○ | ○ | x |

<Evaluation Method of Experimental Example Series E>
(1) Adhesion Strength 1

A 6×6 mm silicon chip was mounted on a silver plated copper frame using the obtained resin composition and cured in an oven of 150° C. for 30 minutes. Hot die shear strength at 260° C. was measured by means of the automatic adhesion strength tester. A measured result having hot die shear strength at 260° C. of 40 N/chip or more was evaluated to have passed the criteria. A unit of adhesion strength is "N/chip".

(2) Adhesion Strength 2

A 6×6 mm silicon chip was mounted on a heat spreader made of copper having black oxide surface using the obtained resin compositions and cured in an oven of 150° C. for 30 minutes. Hot die shear strength at 260° C. was measured by means of the automatic adhesion strength tester. A measured result having hot die shear strength at 260° C. of 40 N/chip or more was evaluated to have passed the criteria. A unit of adhesion strength is "N/chip".

(3) Warpage and Reflow Resistance

The following substrate (lead frame) and the following silicon chip were bonded by curing at 150° C. for 15 minutes using resin compositions shown in Table 5. After curing, warpage of chip surface was measured by means of the surface roughness meter. A unit of warpage is "μm". A measured result having warpage of 20 μm or less was evaluated to have passed the criteria. Also, similarly die bonded lead frame was molded using a molding compound (Sumikon EME-7026, manufactured by Sumitomo Bakelite Company Limited). The package was subject to a moisture absorption treatment for 196 hours in an atmosphere of 30° C. and 60% relative humidity, and then to an IR reflow treatment (260° C., 10 seconds, three times of reflow). The degree of delamination after the treatments was measured by means of the scanning acoustic microscope detector (through scan mode). A measured result having a delaminated area of a die attach portion of less than 10% was evaluated to have passed the criteria. A unit of delaminated area is "%".

Package: QFP (14×20×2.0 mm)
Lead frame: silver spot plated copper frame
Chip size: 9×9 mm
Curing condition of a resin composition: in an oven at 150° C. for 30 minutes Finally, experimental examples of the sixth composition system (Experimental example series F) are hereinafter described. The compounding ratio is in "part by weight".

Examples F1 to F4

Comparative Examples F1 to F3

Polypropylene glycol dimethacrylate (BLEMMER PDP-400, manufactured by NOF Corporation, hereafter referred as "compound 1"), polytetramethylene glycol dimethacrylate (BLEMMER PDT-800, manufactured by NOF Corporation, hereafter referred as "compound 2") and as the compound (B), polyether-based bismaleimide acetic ester (LUMICURE MIA-200, manufactured by DAINIPPON INK & CHEMICALS, INC., a compound wherein $R^2$ is —$C_2H_2$— and $R^3$ is —$CH_2$— in the formula (2), and $X^1$ is —O— and $R^1$ is —$C_4H_8$— in the formula (1), hereafter referred as "compound 3") were used.

As the compound (H), a compound (viscous liquid at room temperature, hereafter referred as "compound 4") wherein after a maleated polybutadiene (number average molecular weight: about 1,000, M-1000-80, manufacture by Nippon Petrochemicals Co., Ltd.) and poly(propyleneglycol-tetramethyleneglycol)monomethacrylate (BLEMMER 50PPT-800, manufactured by NOF Corporation) were reacted in the presence of trimethylamine in toluene at 30° C. for 4 hours, removing a solvent under reduced pressure at 50° C. was performed was used.

As the reactive diluent (I), lauryl acrylate (Light Ester LA, manufactured by KYOEISHA CHEMICAL Co., LTD., hereafter referred as "reactive diluent") was used. As the thermal radical initiator (C), dicumyl peroxide (decomposition temperature: 126° C. in rapid heating test, Percumyl D, manufactured by NOF Corporation, hereafter referred as "initiator") was used. As the filler (A), silver powder in a flake-like form having an average particle size of 3 μm and a maximum particle size of 20 μm (hereafter referred as "silver powder") was used. Also, a silane coupling agent having a methacryl group (KBM-503, manufactured by Shin-Etsu Chemical Co., Ltd., hereafter referred as "methacryl silane") was used.

These compounds were compounded in combination as shown in Table 6 and kneaded by means of the three-roll mill followed by defoaming, thus obtained resin compositions.

In Comparative example F1, polyethylene glycol dimethacrylate (BLEMMER PDE-400, manufactured by NOF Corporation, hereafter referred as "compound 5") was used. In Comparative example F2, acryl-modified polybutadiene (a compound obtained by half esterifying maleated polybutadiene with ethylene glycol methacrylate) (number average molecular weight: about 1,000, MM-1000-80, manufactured by Nippon Petrochemicals Co., Ltd., hereafter referred as "compound 6") was used. In Comparative example F3, diglycidyl bisphenol A obtained by reacting bisphenol A with epichlorohydrin (epoxy equivalent 180, liquid at room temperature, hereafter referred as "bis-A-epoxy"), cresylglycidyl ether (epoxy equivalent: 185, hereafter referred as "CGE"), phenol novolac resin (hydroxyl group: 104, softening point: 85° C., hereafter referred as "PN"), 2-phenyl-4,5-dihydroxymethylimidazole (product name: Curezol, manufacture by Shikoku Chemicals Corporation, hereafter referred as "2PHZ") and a silane coupling agent having a glycidyl group (KBM-403E, manufactured by Shin-Etsu Chemical Co., Ltd., hereafter referred as "epoxy silane") were used.

The obtained resin compositions were evaluated by the following manner. The evaluated results are shown in Table 6.

(121° C., 100%, 72 hours), hot die shear strength at 260° C. was measured by means of the automatic adhesion strength tester. A measured result having hot die shear strength at 260° C. of 50 N/chip or more was evaluated to have passed the criteria. A unit of adhesion strength is "N/chip".

(3) Solder Crack Resistance

The following lead frame and the following silicon chip were bonded by curing under the following curing condition with the use of the obtained resin composition as shown in Table 6 followed by molding by a molding compound (Sumikon EME-7026, manufactured by Sumitomo Bakelite Company Limited). The package was subject to a moisture absorption treatment for 192 hours in an atmosphere of 60° C. and 60% relative humidity, and then to an IR reflow treatment (260° C., 10 seconds, three times of reflow). Then, the degree of delamination of packages after the treatments was measured by means of the scanning acoustic microscope detector (through scan mode). A measured result having a delaminated area of a die attach portion of less than 10% was evaluated to have passed the criteria. A unit of delaminated area is "%".

Package: QFP (14×20×2.0 mm)
Lead frame: silver spot plated copper frame
Chip size: 6×6 mm
Curing condition of a resin composition: a hot plate at 200° C. for 60 seconds

TABLE 6

|  |  |  | Example | | | | Comparative example | | |
| --- | --- | --- | --- | --- | --- | --- | --- | --- | --- |
|  |  |  | F1 | F2 | F3 | F4 | F1 | F2 | F3 |
| Compound 1 | | | 7.8 | | 3.9 | 7.8 | | 7.8 | |
| Compound 2 | | | | 7.8 | | | | | |
| Compound 3 | | | 3.9 | 3.9 | 3.9 | | | 3.9 | |
| Compound 4 | | | 3.9 | 3.9 | 5.8 | 5.8 | 3.9 | | |
| Compound 5 | | | | | | | 11.7 | | |
| Compound 6 | | | | | | | | | 3.9 |
| Reactive diluent | | | 3.9 | 3.9 | 5.8 | 5.8 | 3.9 | 3.9 | |
| Initiator | | | 0.4 | 0.4 | 0.4 | 0.4 | 0.4 | 0.4 | |
| Silver powder | | | 80.0 | 80.0 | 80.0 | 80.0 | 80.0 | 80.0 | 75.0 |
| Bis-A-epoxy | | | | | | | | | 16.1 |
| CGE | | | | | | | | | 6.9 |
| PN | | | | | | | | | 1.1 |
| 2PHZ | | | | | | | | | 0.7 |
| Methacryl silane | | | 0.2 | 0.2 | 0.2 | 0.2 | 0.2 | 0.2 | |
| Epoxy silane | | | | | | | | | 0.2 |
| Viscosity | Initial value (Pa · s) | | 18.2 | 17.6 | 20.4 | 22.6 | 16.4 | 15.8 | 21.4 |
|  | After 48 hours (Pa · s) | | 18.6 | 17.4 | 20.0 | 22.0 | 16.6 | 16.0 | 21.2 |
|  | Viscosity increasing rate | | 2% | −1% | −1% | −3% | 1% | 1% | −1% |
| Adhesion | 30 seconds curing | After curing | 84 | 84 | 90 | 64 | 78 | 63 | 23 |
| strength | (hot plate) | After PCT | 74 | 80 | 78 | 56 | 32 | 48 | 8 |
| (N/chip) | 60 minutes curing | After curing | 76 | 76 | 82 | 60 | 64 | 24 | 54 |
|  | (oven) | After PCT | 64 | 68 | 70 | 54 | 28 | 12 | 24 |
| Soder crack resistance | Delaminated area (%) | | <10 | <10 | <10 | <10 | 50< | <10 | 50< |
| Comprehensive evaluation | | | ○ | ○ | ○ | ○ | x | x | x |

<Evaluation Method of Experimental Example Series F>
(1) Viscosity

Using an E type viscometer (3° cone), values were measured at 2.5 rpm at 25° C. just after producing a resin composition and after leaving for 48 hours at 25° C. A measured result having viscosity of 15 to 25 Pa·s just after production and viscosity increasing rate after 48 hours of less than 20% was evaluated to have passed the criteria. A unit of viscosity is "Pa·s" and a unit of viscosity increasing rate is "%".

(2) Adhesion Strength

A 6×6 mm silicon chip was mounted on a silver spot plated copper frame using the obtained resin composition and cured on a hot plate of 200° C. for 30 seconds and in an oven of 150° C. for 60 minutes respectively. After curing and PCT process

INDUSTRIAL APPLICABILITY

A resin composition of the present invention, particularly a resin composition which belongs to any of the above-mentioned first to sixth composition systems, is excellent in adhesion strength, quick curability, moisture resistance and low stress property, and is excellent in adhesion particularly between a copper lead frame and a semiconductor chip, therefore, it can be suitably used as a die attach paste material for a semiconductor chip.

Also, among the resin compositions of the present invention, the composition which belongs to the third composition system exhibits excellent bleeding property as well as good low stress property and good adhesion, therefore, the resin composition can be suitably used for a semiconductor chip or a heat dissipating member such as a heat sink which requires the above-mentioned bleeding property, low stress property and adhesion at the same time.

The invention claimed is:

1. A semiconductor device comprising, as a die attach material, a resin composition used as an adhesive for bonding a semiconductor chip or a heat dissipating member,
    wherein the resin composition comprises at least a silver powder (A) having an average particle size of 1 to 30 μm, the following compound (B), a thermal radical initiator (C) and the following allyl ester compound (G), and substantially not containing a photo polymerization initiator:
    Compound (B):
        a bismaleimide compound (B') represented by the following formula (3):

Formula (3)

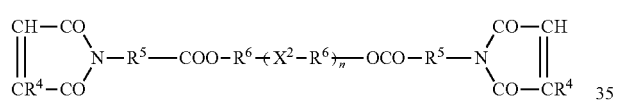
(3)

wherein $X^2$ is —O—; each $R^4$ is a hydrogen atom or a methyl group; each $R^5$ is a hydrocarbon group having 1 to 11 carbons and containing no aromatic group; each $R^6$ is a hydrocarbon group having 3 to 6 carbons and containing no aromatic group; "n" is an integer of 1 to 50; and if the formula contains two or more parts which are denoted by the same symbol, each of them may be the same or different from each other;

Allyl ester compound (G):
    a compound having at least one functional group represented by the following formula (8):

Formula (8)

$$CH_2=CH-CH_2-OCO-R^{12}-\qquad(8)$$

wherein $R^{12}$ is a hydrocarbon group having 2 to 8 carbons.

2. A semiconductor device according to claim 1, wherein $R^{12}$ in the structure represented by formula (8) of the allyl ester compound (G) does not contain an aromatic group.

3. A semiconductor according to claim 1, wherein the allyl ester compound (G) has a structure represented by the following formula (9):

Formula (9)

$$-\!\!\!+\!\!X^5-R^{13})_s-\qquad(9)$$

wherein $X^5$ is —O—, —COO— or —OCOO—; $R^{13}$ is a hydrocarbon group having 3 to 6 carbons; "s" is an integer of 1 or more and 50 or less; and if the formula contains two or more parts which are denoted by the same symbol, each of them may be the same or different from each other.

4. A semiconductor device comprising, as a material for bonding a heat dissipating member, a resin composition used as an adhesive for bonding a semiconductor chip or a heat dissipating member,
    wherein the resin composition comprises at least a silver powder (A) having an average particle size of 1 to 30 μm, the following compound (B), a thermal radical initiator (C) and the following allyl ester compound (G), and substantially not containing a photo polymerization initiator:
    Compound (B):
        a bismaleimide compound (B') represented by the following formula (3):

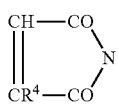 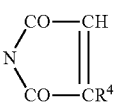

wherein $X^2$ is —O—, each $R^4$ is a hydrogen atom or a methyl group; each $R^5$ is a hydrocarbon group having 1 to 11 carbons and containing no aromatic group; each $R^6$ is a hydrocarbon group having 3 to 6 carbons and containing no aromatic group; "n" is an integer of 1 to 50; and if the formula contains two or more parts which are denoted by the same symbol, each of them may be the same or different from each other;

Allyl ester compound (G):
    a compound having at least one functional group represented by the following formula (8):

Formula (8):

$$CH_2=CH-CH_2-OCO-R^{12}-\qquad(8)$$

wherein $R^{12}$ is a hydrocarbon group having 2 to 8 carbons.

5. A semiconductor device according to claim 4, wherein $R^{12}$ in the structure represented by formula (8) of the allyl ester compound (G) does not contain an aromatic group.

6. A semiconductor device according to claim 4, wherein the allyl ester compound (G) has a structure represented by the following formula (9):

Formula (9):

$$-\!\!\!+\!\!X^5-R^{13})_s-\qquad(9)$$

wherein $X^5$ is —O—, —COO— or —OCOO—; $R^{13}$ is a hydrocarbon group having 3 to 6 carbons; "s" is an integer of 1 or more and 50 or less; and if the formula contains two or more parts which are denoted by the same symbol, each of them may be the same or different from each other.

* * * * *